(12) United States Patent
Han et al.

(10) Patent No.: US 11,475,340 B2
(45) Date of Patent: Oct. 18, 2022

(54) METHOD AND ELECTRONIC DEVICE FOR PREDICTING ELECTRONIC STRUCTURE OF MATERIAL

(71) Applicant: KOREA INSTITUTE OF SCIENCE AND TECHNOLOGY, Seoul (KR)

(72) Inventors: Sang Soo Han, Seoul (KR); Byung Chul Yeo, Seoul (KR); Dong Hun Kim, Seoul (KR); Seung Chul Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 882 days.

(21) Appl. No.: 16/335,235

(22) PCT Filed: Aug. 13, 2018

(86) PCT No.: PCT/KR2018/009278
§ 371 (c)(1),
(2) Date: Mar. 20, 2019

(87) PCT Pub. No.: WO2019/045320
PCT Pub. Date: Mar. 7, 2019

(65) Prior Publication Data
US 2019/0251459 A1  Aug. 15, 2019

(30) Foreign Application Priority Data

Aug. 28, 2017  (KR) .......................... 10-2017-0108850
Jul. 19, 2018  (KR) .......................... 10-2018-0084269
Jul. 19, 2018  (KR) .......................... 10-2018-0084270

(51) Int. Cl.
*G06N 20/00*   (2019.01)
*G06N 5/04*    (2006.01)
(Continued)

(52) U.S. Cl.
CPC ............. *G06N 5/048* (2013.01); *G06F 17/16* (2013.01); *G06F 30/00* (2020.01); *G06F 30/20* (2020.01); *G06N 20/00* (2019.01); *G06N 99/00* (2013.01)

(58) Field of Classification Search
None
See application file for complete search history.

(56) References Cited

U.S. PATENT DOCUMENTS 6,122,042 A * 9/2000 Wunderman ........ A61B 1/0684
356/73
2019/0120049 A1 * 4/2019 Chen .................. G01N 33/2823

FOREIGN PATENT DOCUMENTS

JP  2014-038595 A  2/2014
JP  2015-141533 A  8/2015
(Continued)

OTHER PUBLICATIONS

P. P. Altermatt et al., A simulation model for the density of states and for incomplete ionization in crystalline silicon. I. Establishing the model in Si:P, 2006, Journal of Applied Physics 100, 113714, p. 1-11 (Year: 2006).*

(Continued)

*Primary Examiner* — David R Vincent
(74) *Attorney, Agent, or Firm* — Rabin & Berdo, P.C.

(57) ABSTRACT

A method, performed by an electronic device, of predicting an electronic structure of a material includes: receiving input data of a user related to elements constituting the first material; applying the received input data to a trained model for estimating a density of state of the first material; and outputting a first graph indicating the density of state for each energy level of the first material output from the trained model, wherein the trained model is trained to generate the first graph based on pre-input data about a plurality of second materials composed of at least some of the elements (Continued)

constituting the first material and a plurality of second graphs representing the density of state for each energy level of the plurality of second materials.

14 Claims, 20 Drawing Sheets

(51) Int. Cl.
*G06F 17/16* (2006.01)
*G06N 99/00* (2019.01)
*G06F 30/00* (2020.01)
*G06F 30/20* (2020.01)

(56) References Cited

FOREIGN PATENT DOCUMENTS

| | | |
|---|---|---|
| JP | 2017-120640 A | 7/2017 |
| KR | 10-2005-0103654 A | 11/2005 |
| KR | 10-2009-0083763 A | 8/2009 |
| KR | 10-2010-0042453 A | 4/2010 |
| KR | 10-2010-0079659 A | 7/2010 |

OTHER PUBLICATIONS

Korean Office Action dated Jul. 16, 2018.
Korean Notice of Allowance dated Jan. 2, 2019.

\* cited by examiner

| | $n_{d,Cu}$ | $n_{d,Fe}$ | CN | $F_{mix}$ |
|---|---|---|---|---|
| Cu | 1 | 0 | 12 | 0 |
| $Cu_{0.75}Fe_{0.25}$ | 0.83 | 0.17 | 12 | 0.38 |
| $Cu_{0.50}Fe_{0.50}$ | 0.62 | 0.38 | 12 | 0.51 |
| $Cu_{0.25}Fe_{0.75}$ | 0.36 | 0.64 | 8 | 0.41 |
| Fe | 0 | 1 | 8 | 0 |
| $Cu_{0.375}Fe_{0.625}$ | 0.50 | 0.50 | 12 | 0.45 |

FIG. 12B

| | $n_{d,Cu}$ | $n_{d,Ni}$ | $n_{d,Pt}$ | CN | $F_{mix}$ |
|---|---|---|---|---|---|
| Cu | 1.00 | 0.00 | 0.00 | 12 | 0.00 |
| $Cu_{0.75}Ni_{0.25}$ | 0.79 | 0.21 | 0.00 | 12 | 0.41 |
| $Cu_{0.75}Pt_{0.25}$ | 0.77 | 0.00 | 0.23 | 12 | 0.50 |
| $Cu_{0.50}Ni_{0.50}$ | 0.56 | 0.44 | 0.00 | 12 | 0.50 |
| $Cu_{0.50}Ni_{0.25}Pt_{0.25}$ | 0.54 | 0.22 | 0.24 | 12 | 0.65 |
| $Cu_{0.50}Pt_{0.50}$ | 0.53 | 0.00 | 0.47 | 9 | 0.83 |
| $Cu_{0.25}Ni_{0.75}$ | 0.29 | 0.71 | 0.00 | 12 | 0.35 |
| $Cu_{0.25}Ni_{0.50}Pt_{0.25}$ | 0.29 | 0.46 | 0.26 | 12 | 0.63 |
| $Cu_{0.25}Ni_{0.25}Pt_{0.50}$ | 0.28 | 0.22 | 0.50 | 12 | 0.68 |
| $Cu_{0.25}Pt_{0.75}$ | 0.27 | 0.00 | 0.73 | 12 | 0.38 |
| Ni | 0.00 | 1.00 | 0.00 | 12 | 0.00 |
| $Ni_{0.75}Pt_{0.25}$ | 0.00 | 0.73 | 0.27 | 12 | 0.50 |
| $Ni_{0.50}Pt_{0.50}$ | 0.00 | 0.47 | 0.53 | 12 | 0.56 |
| $Ni_{0.25}Pt_{0.75}$ | 0.00 | 0.23 | 0.77 | 12 | 0.39 |
| Pt | 0.00 | 0.00 | 1.00 | 12 | 0.00 |
| *$Cu_{0.06}Ni_{0.06}Pt_{0.88}$ | 0.07 | 0.06 | 0.88 | 12 | 0.10 |
| *$Cu_{0.31}Ni_{0.34}Pt_{0.34}$ | 0.35 | 0.31 | 0.34 | 12 | 0.62 |

METHOD AND ELECTRONIC DEVICE FOR PREDICTING ELECTRONIC STRUCTURE OF MATERIAL

TECHNICAL FIELD

The present disclosure relates to a method and an electric device for predicting an electronic structure of a material.

BACKGROUND ART

Physical properties such as metallic properties and electric conductivity of a material are determined by an electronic structure of the material (e.g., a structure of an energy band of electrons).

A new material is being developed through a method of determining physical properties of a material by using an electronic structure of the material. For example, a semiconductor material is being developed using information about a band gap, which is energy required for electrons to be excited from a valence band to a conduction band level. Chemical materials, such as a catalyst or a secondary battery, are also being developed using an electronic structure of the material.

Density of state (DOS) is mainly used to identify an electronic structure of a material. In more detail, the electronic structure of the material may be determined by graphing the DOS according to energy, and physical properties of the material may be determined.

Conventionally, the DOS of a material is estimated by methods such as Empirical, Tight Binding, a density functional theory (DFT), and Beyond DFT, and an electronic structure of the material is predicted by using the estimated DOS. However, a conventional method of predicting an electronic structure has a problem in that accuracy is low when a prediction time is fast, and a lot of time is required for the prediction when the accuracy is to be high. For example, DFT (in a first principles calculation method), which is the most commonly used method computationally to estimate the DOS of the material, estimates a DOS of a single material, which takes about 2-3 days to estimate, resulting in excessive time and cost.

Therefore, a DOS of a plurality of materials is required to develop a new material, and therefore, there is a need for a method capable of estimating the DOS of the materials with high accuracy and at high speed.

DESCRIPTION OF EMBODIMENTS

Technical Problem

Provided is a method and an electric device for predicting an electronic structure of a material. Additional features and advantages will be set forth in part in the description which follows and, in part, will be apparent from the description, or may be learned by practice of the presented embodiments.

Solution to Problem

According to an aspect of the present disclosure, a method, performed by an electronic device, of predicting an electronic structure of a first material includes: receiving input data of a user related to elements constituting the first material; applying the received input data to a trained model for estimating a density of state of the first material; and outputting a first graph indicating the density of state for each energy level of the first material output from the trained model, wherein the trained model is trained to generate the first graph based on pre-input data about a plurality of second materials composed of at least some of the elements constituting the first material and a plurality of second graphs representing the density of state for each energy level of the plurality of second materials.

The trained model may be trained to: convert each of the plurality of second graphs into a grid image, determine at least one principal component vector representing a characteristic of the first graph, based on the grid images obtained by converting the plurality of second graphs, and generate the first graph based on the determined at least one principal component vector.

The trained model may be trained to: obtain, from the received input data of the user, at least one of composition information indicating an electronic structure of each of the plurality of elements constituting the first material and crystal structure information indicating a crystal structure of the first material, determine a coefficient of the at least one principal component vector based on at least one of the obtained composition information and the crystal structure information, and generate the first graph based on a linear combination of the determined at least one principal component vector and the determined coefficient of the at least one principal component vector.

The composition information may include a d-orbital electron occupation rate of each of the plurality of elements constituting the first material, and the trained model may be trained to determine a coefficient of the at least one principal component vector based on the obtained d-orbital electron occupation rates.

The crystal structure information may include at least one of a coordination number of the first material and a mixing factor of the first material, and the trained model may be trained to determine a coefficient of the at least one principal component vector based on the obtained coordination number and the mixing factor.

The trained model may be trained to: determine a weight to be applied to each of the composition information and the crystal structure information based on kinds of the elements constituting the first material, and determine the coefficient of the at least one principal component vector based on the determined weight.

The trained model may be trained to: determine a similarity between each of the plurality of second materials and the first material, determine a coefficient of the at least one principal component vector based on the determined weight, and generate the first graph based on a linear combination of the determined at least one principal component vector and the determined coefficient of the at least one principal component vector.

The trained model may be trained to: obtain, from the received input data of the user, first composition information indicating an electronic structure of each of the plurality of elements constituting the first material and first crystal structure information indicating a crystal structure of the first material, obtain, from training data, second composition information and second crystal structure information of a third material, which is one of the plurality of second materials, and determine a similarity between the first material and the third material based on the obtained first composition information, the first crystal structure information, the second composition information, and the second crystal structure information.

The first composition information may include a d-orbital electron occupation rate of each of the plurality of elements constituting the first material, the second composition information may include a d-orbital electron occupation rate of each of the plurality of elements constituting the third material, and the trained model may be trained to determine the similarity between the first material and the third material based on the d-orbital electron occupation rate of each of the plurality of elements constituting the first material and the d-orbital electron occupation rate of each of the plurality of elements constituting the third material.

The first crystal structure information may include a coordination number of the first material and a mixing factor of the first material, the second crystal structure information may include a coordination number of the third material and a mixing factor of the third material, and the trained model may be trained to determine the similarity between the first material and the third material based on the coordination number of the first material, the mixing factor of the first material, the coordination number of the third material, and the mixing factor of the third material.

The trained model may be trained to: determine a weight to be applied to a coefficient of a principal component vector of each of the plurality of second materials based on the similarity between the first material and the third material, and determine a coefficient of the at least one principal component vector used to generate the first graph based on the determined weight.

The trained model may be trained to: generate an image vector representing the density of state for each energy level of the first material based on a linear combination of the determined at least one principal component vector and the determined coefficient of the at least one principal component vector, convert the generated image vector into a matrix, and generate the first graph based on the converted matrix.

The trained model may be trained to: convert the matrix into a probability matrix indicating a probability that density of state exists for each energy level, and generate the first graph based on the converted probability matrix.

According to an aspect of the present disclosure, an electronic device for predicting an electronic structure of a first material includes: a user input interface receiving input data of a user related to elements constituting the first material; a processor applying the received input data to a trained model for estimating a density of state of the first material; and an output interface outputting a first graph indicating the density of state for each energy level of the first material output from the trained model, wherein the trained model is trained to generate the first graph based on pre-input data about a plurality of second materials composed of at least some of the elements constituting the first material and a plurality of second graphs representing the density of state for each energy level of the plurality of second materials.

Furthermore, the trained model may be trained to: convert each of the plurality of second graphs into a grid image, determine at least one principal component vector representing a characteristic of the first graph, based on the grid images obtained by converting the plurality of second graphs, and generate the first graph based on the determined at least one principal component vector.

Furthermore, the trained model may be trained to: obtain, from the received input data of the user, at least one of composition information indicating an electronic structure of each of the plurality of elements constituting the first material and crystal structure information indicating a crystal structure of the first material, determine a coefficient of the at least one principal component vector based on at least one of the obtained composition information and the crystal structure information, and generate the first graph based on a linear combination of the determined at least one principal component vector and the determined coefficient of the at least one principal component vector.

Furthermore, the composition information may include a d-orbital electron occupation rate of each of the plurality of elements constituting the first material, and the trained model may be trained to determine a coefficient of the at least one principal component vector based on the obtained d-orbital electron occupation rates.

Furthermore, the crystal structure information may include at least one of a coordination number of the first material and a mixing factor of the first material, and the trained model may be trained to determine a coefficient of the at least one principal component vector based on the obtained coordination number and the mixing factor.

Furthermore, the trained model may be trained to: determine a weight to be applied to each of the composition information and the crystal structure information based on kinds of the elements constituting the first material, and determine the coefficient of the at least one principal component vector based on the determined weight.

Furthermore, the trained model may be trained to: determine a similarity between each of the plurality of second materials and the first material, determine a coefficient of the at least one principal component vector based on the determined weight, and generate the first graph based on a linear combination of the determined at least one principal component vector and the determined coefficient of the at least one principal component vector.

Furthermore, the trained model may be trained to: obtain, from the received input data of the user, first composition information indicating an electronic structure of each of the plurality of elements constituting the first material and first crystal structure information indicating a crystal structure of the first material, obtain, from training data, second composition information and second crystal structure information of a third material, which is one of the plurality of second materials, and determine a similarity between the first material and the third material based on the obtained first composition information, the first crystal structure information, the second composition information, and the second crystal structure information.

Furthermore, the first composition information may include a d-orbital electron occupation rate of each of the plurality of elements constituting the first material, the second composition information may include a d-orbital electron occupation rate of each of the plurality of elements constituting the third material, and the trained model may be trained to determine the similarity between the first material and the third material based on the d-orbital electron occupation rate of each of the plurality of elements constituting the first material and the d-orbital electron occupation rate of each of the plurality of elements constituting the third material.

Furthermore, the first crystal structure information may include a coordination number of the first material and a mixing factor of the first material, the second crystal structure information may include a coordination number of the third material and a mixing factor of the third material, and the trained model may be trained to determine the similarity between the first material and the third material based on the coordination number of the first material, the mixing factor of the first material, the coordination number of the third material, and the mixing factor of the third material.

Furthermore, the trained model may be trained to: determine a weight to be applied to a coefficient of a principal component vector of each of the plurality of second materials based on the similarity between the first material and the third material, and determine a coefficient of the at least one principal component vector used to generate the first graph based on the determined weight.

Furthermore, the trained model may be trained to: generate an image vector representing the density of state for each energy level of the first material based on a linear combination of the determined at least one principal component vector and the determined coefficient of the at least one principal component vector, convert the generated image vector into a matrix, and generate the first graph based on the converted matrix.

Furthermore, the trained model may be trained to: convert the matrix into a probability matrix indicating a probability that density of state exists for each energy level, and generate the first graph based on the converted probability matrix.

Furthermore, as a technical means for achieving the above-mentioned technical problem, a non-transitory computer-readable recording medium may be a recording medium having recorded thereon a program which, when executed by a computer, performs an embodiment of the disclosed method.

BRIEF DESCRIPTION OF DRAWINGS

FIG. 12B is a table of a coordination number, a mixing factor, and a d-orbital electron occupation rate of elements corresponding to each of materials, according to an embodiment.

MODE OF DISCLOSURE

Figure 1:
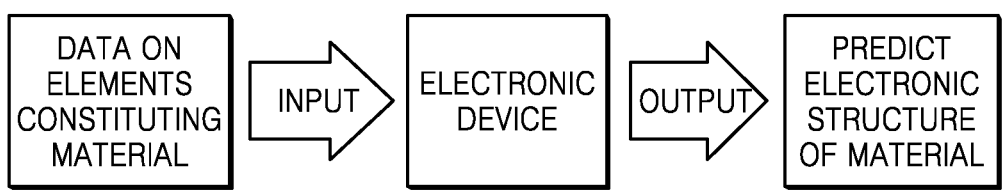
FIG. 1 is a view of an example of a method of predicting an electronic structure of a material, according to an embodiment.

Reference will now be made in detail to embodiments, examples of which are illustrated in the accompanying drawings, wherein like reference numerals refer to like elements throughout. In this regard, the present disclosure may have different forms and should not be construed as being limited to the descriptions set forth herein. In addition, descriptions of well-known functions and constructions will be omitted for clarity and conciseness, and similar reference numerals are assigned to similar elements throughout the specification.

Some embodiments of the present disclosure may be represented by the functional block configurations and various processing steps. Some or all of these functional blocks may be implemented in hardware and/or software configuration of the various number of executing a particular function. For example, the functional blocks of the present disclosure may be implemented by one or more microprocessors, or by circuit configurations for a predetermined function. Also, for example, the functional blocks of the present disclosure may be implemented in various programming or scripting languages. Functional blocks may be realized by algorithms executed in more than one processor. In addition, the present disclosure may adopt related-art technology for electronic environment set-up, signal processing, and/or data processing, etc. Terms such as "factor", "element", "unit" and "formation" may be widely used, and not limited to mechanical and physical formations.

Throughout the specification, it will be understood that when a unit is referred to as being "connected" to another element, it may be "directly connected" to the other element or "electrically connected" to the other element in a state in which intervening elements are present. In addition, it will be understood that when a unit is referred to as "comprising" another element, it may not exclude the other element but may further include the other element unless specifically oppositely indicated.

Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device.

It will be understood that, although the terms first, second, etc. may be used herein to describe various elements, these elements should not be limited by these terms. These terms are only used to distinguish one element from another.

For example, in this specification, a material to be predicted of an electronic structure is described as a first material, and a material composed of at least some of a plurality of elements constituting the first material is described as a second material. However, these are only used to distinguish the first material from the second material, and thus the present disclosure should not be limited thereto.

Hereinafter, the present disclosure will be described in detail with reference to the accompanying drawings.

FIG. 1 is a view of an example of a method of predicting an electronic structure of a material, according to an embodiment.

Referring to FIG. 1, an electronic device 1000 may receive data about elements constituting the material. The electronic device 1000 may predict the electronic structure of the material based on the data input from a user. The electronic device 1000 may output a result of the predicting of the electronic structure of the material.

According to an embodiment, the electronic device 1000 may receive data about elements constituting the first material to predict the electronic structure. Also, the electronic device 1000 may receive data for a plurality of second materials as training data to be applied to a trained model to predict an electronic structure of the first material. The second materials may be composed of at least some of the plurality of elements constituting the first material.

According to an embodiment, the data for the elements constituting the first material input to the electronic device 1000 may include, but is not limited to, data about the kinds of the elements constituting the first material, the number of atoms, the number of electrons, a chemical formula, and an empirical formula.

According to an embodiment, the electronic device 1000 may apply data about the number of elements constituting the first material, the kinds of elements, the number of atoms, the number of electrons, the chemical formula, and the empirical formula input from a user to a trained model for estimating the density of state of a material, and may predict the electronic structure of the material.

According to an embodiment, the trained model may be trained to generate a graph corresponding to the first material input from the user, based on a graph for predicting an electronic structure of a plurality of second materials corresponding to each of plural pieces of pre-input data about elements constituting first materials. For example, the trained model may be trained to generate a graph of density of state for each energy level of the first material input from the user, based on a graph of density of state for each energy level corresponding to pre-input data about the plurality of second materials composed of at least some of the elements constituting the first material and the graph of density of state for each energy level of the plurality of second materials.

According to an embodiment, the electronic device 1000 may generate a graph for predicting the electronic structure of the first material based on the data about the number of elements constituting the first material, the kinds of elements, the number of atoms, the number of electrons, the chemical formula, and the empirical formula input from a user. For example, the electronic device 1000 may generate a graph of density of state for each energy level of the first material to predict the electronic structure of the first material and may output the generated graph of density of state for each energy level of the first material.

Figure 2:
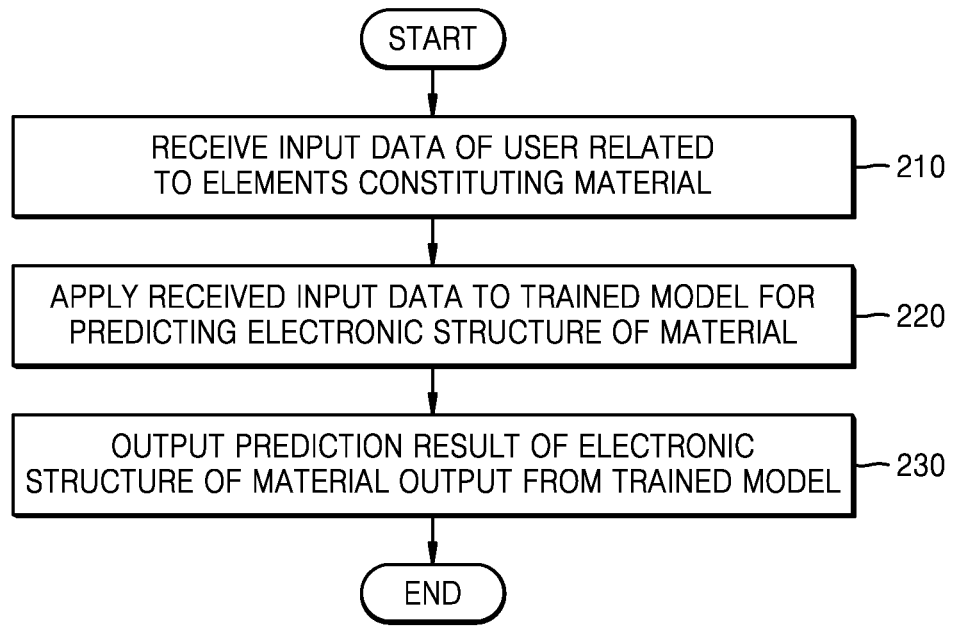
FIG. 2 is a flowchart of a method of predicting an electronic structure of a material, according to an embodiment.

FIG. 2 is a flowchart of a method of predicting an electronic structure of a material, according to an embodiment.

Referring to operation 210, the electronic device 1000 may receive data related to elements constituting the material from a user. That is, the electronic device 1000 may receive data related to the first material for which the user wants to predict the electronic structure.

According to an embodiment, the electronic device 1000 may receive, but is not limited to, data about the number of elements constituting the first material, the kinds of elements, the number of atoms, the number of electrons, a chemical formula, and an empirical formula input from the user.

Referring to operation 220, the electronic device 1000 may apply data related to the elements constituting the first material received from the user to a trained model for predicting the electronic structure of the material.

According to an embodiment, the electronic device 1000 may apply data about the number of elements constituting the first material, the kinds of elements, the number of atoms, the number of electrons, the chemical formula, and the empirical formula input from the user to a trained model for estimating the density of state of a material. The trained model for estimating the density of state of a material will be described later below with reference to FIG. 3.

Referring to operation 230, the electronic device 1000 may output a prediction result of the electronic structure of the first material output from the trained model.

According to an embodiment, the electronic device 1000 may output, but is not limited to, atomic structure information such as state density data of the first material and a grid constant of the first material from the trained model.

According to an embodiment, the electronic device 1000 may output, but is not limited to, the state density data of the first material to a graph of density of state for each energy level of a material.

According to an embodiment, a graph of density of state for each energy level of the first material output from the trained model may be generated based on a principal component determined in the trained model, but is not limited thereto.

According to an embodiment, the graph of density of state for each energy level of the first material output from the trained model may be generated based on the number of principal components determined based on user's input data about the elements constituting the first material, but is not limited thereto.

According to an embodiment, the graph of density of state for each energy level of the first material output from the trained model may be generated by a linear combination of at least one principal component vector and a coefficient of the at least one principal component vector, but is not limited thereto. For example, the graph of density of state for each energy level of the first material output from the trained model may be generated based on Equation 1.

$$DOS(E) = \alpha_1 \times PC1(E) + \alpha_2 \times PC2(E) + \alpha_3 \times PC3(E) + \alpha_4 \times PC4(E) \quad \text{[Equation 1]}$$

Where DOS (E) is an image vector representing the graph of density of state for each energy level of the first material, PC1 (E) is a first principal component vector representing the first principal component graph for each energy level of the first material, PC2 (E) is a second principal component vector representing a second principal component graph for each energy level of the first material, PC3 (E) is a third principal component vector representing a third principal component graph for each energy level of the first material, PC4 (E) is a fourth principal component vector representing a fourth principal component graph for each energy level of the first material, $\alpha_1$ is a coefficient of the first principal component vector, $\alpha_2$ is a coefficient of the second principal component vector, $\alpha_3$ is a coefficient of the third principal component vector, and $\alpha_4$ is a coefficient of the fourth principal component vector.

A method for the electronic device 1000 to output the graph of density of state for each energy level of the first material will be described later below with reference to FIGS. 6 to 11.

Figure 3:
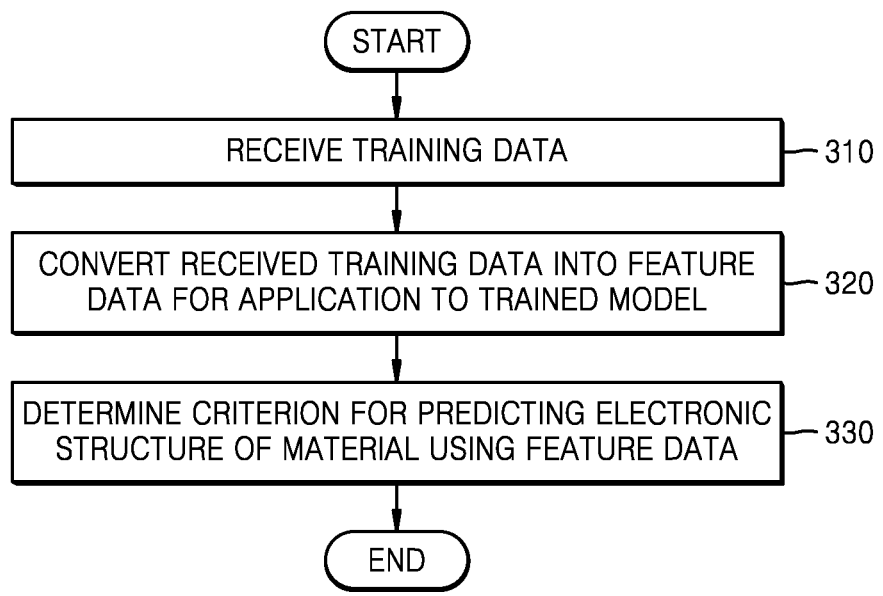
FIG. 3 is a flowchart of a method of machine-learning data for predicting an electronic structure of a material, according to an embodiment.
Figure 4:
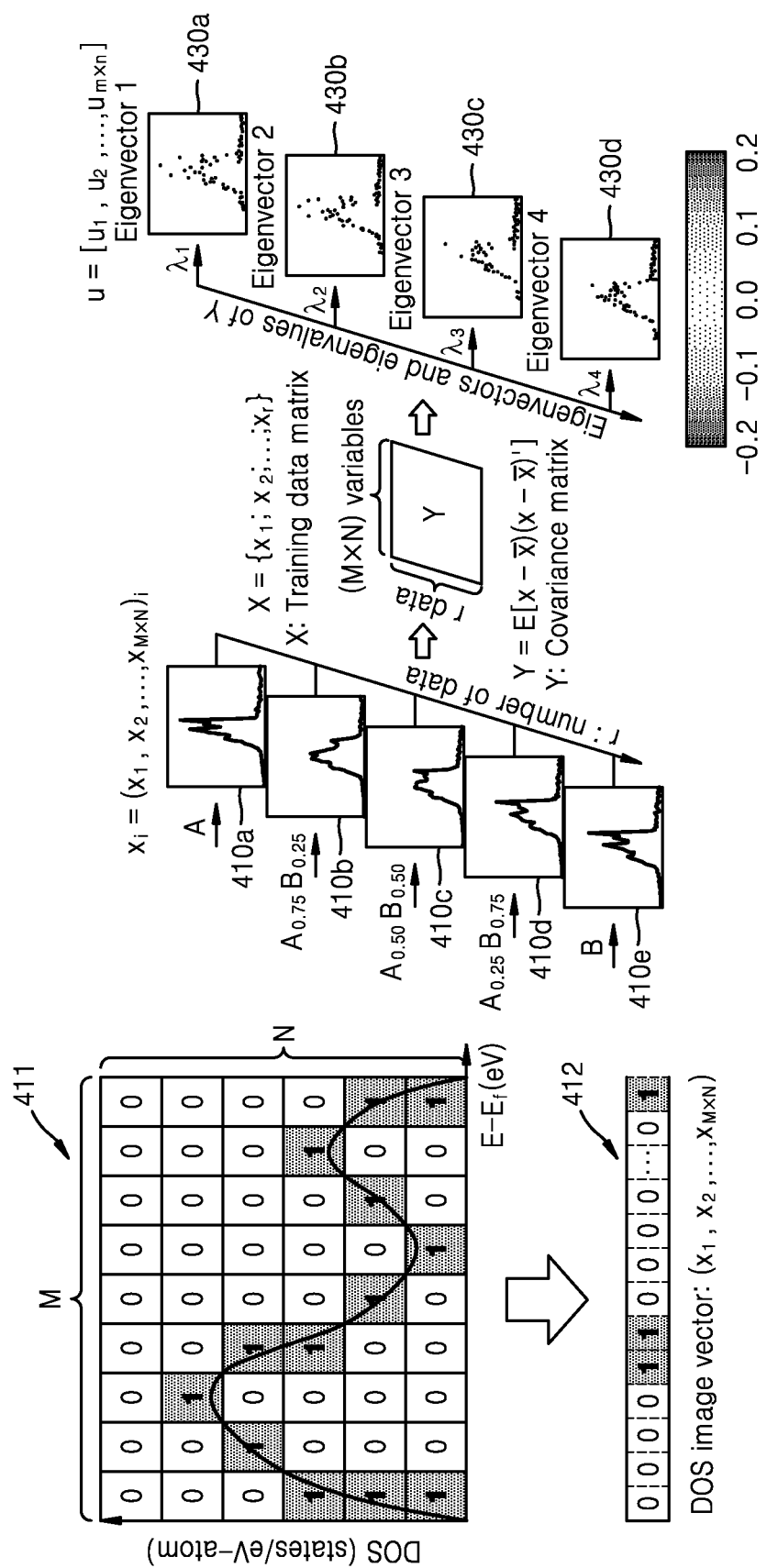
FIG. 4 is a conceptual diagram of a method of machine-learning data for predicting an electronic structure of a material, according to an embodiment.

FIG. 3 is a flowchart of a method of machine-learning data for predicting an electronic structure of a material, according to an embodiment, and FIG. 4 is a conceptual diagram of a method of machine-learning data for predicting an electronic structure of a material, according to an embodiment.

Referring to operation 310, the electronic device 1000 may receive training data from a user for learning a criterion for predicting the electronic structure of the first material by the trained model.

According to an embodiment, the electronic device 1000 may receive data related to a plurality of second materials composed of at least some of elements constituting the first material and a result of predicting an electronic structure of each of the plurality of second materials from a user as training data. Plural pieces of data related to the plurality of second materials may include, but is not limited to, the number of elements constituting each of the plurality of second materials, the kinds of element, the number of atoms, the number of electrons, a chemical formula, an empirical formula, and the like. The result of predicting the electronic structure of each of the plurality of second materials may include state density data of each of the plurality of second materials. In addition, the state density data may include, but is not limited to, a graph of density of state for each energy level.

Referring to FIG. 4, the electronic device 1000 may receive data related to a plurality of second materials composed of at least a portion of elements A and B from a user as training data for predicting an electronic structure of a first material composed of the elements A and B.

For example, the electronic device 1000, as the data related to the plurality of second materials, may receive [A], $[A_{0.75}B_{0.25}]$, $[A_{0.5}B_{0.5}]$, $[A_{0.25}B_{0.75}]$, and [B], which are chemical formulas of the second materials, and graphs of density of state 410a, 410b, 410c, 410d, and 410e for their energy levels from the user. The electronic device 1000 may accurately predict the electronic structure of the first material as the training data received from the user is greater.

Referring to operation 320, the electronic device 1000 may convert the training data received from the user into feature data for application to a trained model. The electronic device 1000 may be applied to the trained model using the converted feature data.

According to an embodiment, the electronic device 1000 may convert the received data related to the second materials and a result of predicting the electronic structure of the plurality of second materials into the feature data for application to the trained model. For example, each of the graphs of density of state for each energy level of the plurality of second materials may be converted into a grid image, but is not limited thereto.

For example, referring to FIG. 4, the electronic device 1000 may convert each of the received graphs of density of state 410a, 410b, 410c, 410d, and 410e for energy level of the plurality of second materials into an M×N (M and N are natural numbers) grid image 411. The electronic device 1000 may also convert grid images 411 into M×N matrices. In addition, the electronic device 1000 may convert the M×N matrices into image vectors 412.

Referring to operation 330, the electronic device 1000 may determine a criterion for predicting the electronic structure of the first material using the feature data applied to the trained model.

According to an embodiment, the electronic device 1000 may determine the criterion for predicting the electronic structure of the first material using the converted plurality of grid images. Alternatively, the electronic device 1000 may determine the criterion for predicting the electronic structure of the first material using matrices obtained by converting the grid images 411. Alternatively, the electronic device 1000 may determine the criterion for predicting the electronic structure of the first material using the image vectors 412 obtained by converting the matrices.

According to an embodiment, the criterion for predicting the electronic structure of the first material may be a principal component vector for generating a graph of density of state for each energy level of the first material. Further, the electronic device 1000 may determine a coefficient of the principal component vector as the criterion for predicting the electronic structure of the first material. The electronic device 1000, as the criterion for predicting the electronic structure of the first material, may determine a relationship between the coefficient of the principal component vector and at least one of a d-orbital electron occupation rate of each of a plurality of elements constituting the first material, a coordination number (CN) of the first material, and a mixing factor ($F_{mix}$) of the first material.

Figure 5:
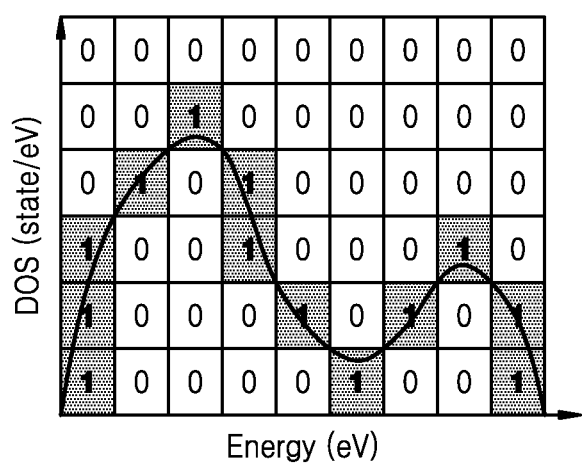
FIG. 5 is a view of conversion of a graph of density of state for each energy level of a material converted into a grid image into feature data for application to a trained model, according to an embodiment.

FIG. 5 is a view of conversion of a graph of density of state for each energy level of a material converted into a grid image into feature data for application to a trained model, according to an embodiment.

According to an embodiment, the electronic device 1000 may convert graphs of density of state for each energy level of a plurality of second materials into a grid image composed of a predetermined number of grids. For example, the electronic device 1000 may convert each of the graphs of density of state for each energy level of the plurality of second materials into a grid image consisting of M (M is a natural number) grids in a horizontal direction and N (N is a natural number) grids in a vertical direction.

According to an embodiment, the electronic device 1000 may input data values to each of the grids constituting the grid image. For example, in the electronic device 1000, a value of 1 may be input to grids corresponding to a function curve of the density of state for each energy level constituting the graphs of density of state for each energy level of the plurality of second materials from among the grids constituting the grid image, and a value of 0 may be input to the remaining grids.

According to an embodiment, the electronic device 1000 may convert the grid image into a matrix. For example, the electronic device 1000 may convert an M×N grid image into an M×N matrix by inputting a data value input to each of the plurality of grids to a corresponding component of the matrix. Here, the matrix is density of state for each energy level of a second material, which is input as training data.

According to an embodiment, the electronic device 1000 may convert the M×N matrix into an image vector. Here, the image vector is the density of state for each energy level of the second material, which is input as training data. For example, referring to FIG. 4, the electronic device 1000 may convert the M×N matrix into the image vector 412 by sequentially substituting values input from the upper left corner to the lower right corner of the M×N matrix to a 1×L matrix (where L is the product of the natural number M and the natural number N).

Figure 6:
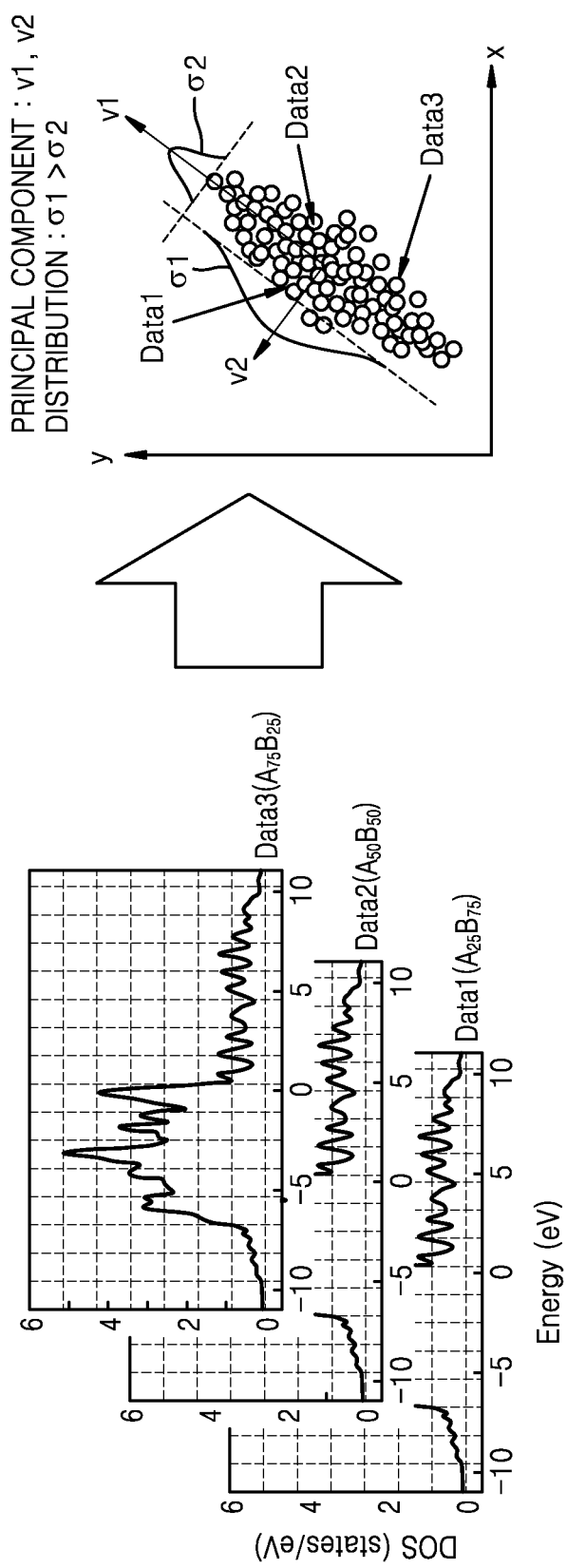
FIG. 6 is a conceptual diagram of determination of a principal component vector for respective graphs of density of state for each energy level of a plurality of materials input as training data, according to an embodiment.

FIG. 6 is a conceptual diagram of determination of a principal component vector for respective graphs of density of state for each energy level of a plurality of materials input as training data, according to an embodiment.

According to an embodiment, the electronic device 1000 may determine at least one principal component vector for a graph of density of state for each energy level as a criterion for predicting an electronic structure of a first material.

According to an embodiment, the electronic device 1000 may determine a principal component (v1, v2) vector for generating a graph of density of state for each energy level of the first material using data about a plurality of second materials and state density data of each of the plurality of second materials that are received. For example, the electronic device 1000 may determine at least one principal component vector using covariance for state density data about each energy level of the plurality of second materials. In addition, the state density data of each of the second materials may include, but is not limited to, a graph of density of state for each energy level.

For example, the electronic device 1000 may receive data related to material [$A_{25}B_{75}$] and a graph of density of state for each energy level of the material [$A_{25}B_{75}$] as first training data Data1, data related to material [$A_{50}B_{50}$] and a graph of density of state for each energy level of the material [$A_{50}B_{50}$] as second training data Data2, and data related to material [$A_{75}B_{25}$] and a graph of density of state for each energy level of the material [$A_{75}B_{25}$] as third training data Data3, as input data from a user.

Also, the electronic device 1000 may convert each of the pieces of received data related to the plurality of second materials into feature data for application to a trained model. For example, the electronic device 1000 may convert each of graphs of density of state for each energy level of the plurality of second materials into a grid image. The electronic device 1000 may convert a plurality of grid images into a plurality of matrices.

In addition, the electronic device 1000 may convert each of the plurality of matrices into an image vector. For example, referring to FIG. 4, the electronic device 1000 may convert each of the graphs of density of state 410*a* , 410*b* , 410*c* , 410*d* , and 410*e* for each energy level into the M×N grid image 411. The electronic device 1000 may also convert the grid image 411 into an M×N matrix. In addition, the electronic device 1000 may convert the M×N matrix into the image vector 412. According to an embodiment, the electronic device 1000 may determine at least one principal component vector for graphs of density of state for each energy level based on a plurality of matrices or a plurality of image vectors. The electronic device 1000 may calculate covariance using the plurality of image vectors obtained by converting the plurality of matrices. For example, the electronic device 1000 may determine the principal component vector by performing principal component analysis (PCA) on the plurality of matrices or the plurality of image vectors.

In addition, the electronic device 1000 may calculate the covariance of the plurality of matrices or the plurality of image vectors. The electronic device 1000 may calculate at least one eigenvector and at least one eigenvalue based on the calculated covariance. The electronic device 1000 may determine the calculated at least one eigenvector as the principal component vector.

For example, referring to FIG. 4, the electronic device 1000 may generate a covariance matrix 420 using the plurality of image vectors 412 obtained by converting the plurality of matrices. The electronic device 1000 may calculate at least one of eigenvectors 430*a* , 430*b* , 430*c* , and 430*d* and at least one of eigenvalues $\lambda 1, \lambda 2, \lambda 3$, and $\lambda 4$ from the covariance matrix. The electronic device 1000 may determine at least one principal component vector using the calculated at least one of the eigenvectors 430*a* , 430*b* , 430*c* , and 430*d* and the calculated at least one of the eigenvalues $\lambda 1, \lambda 2, \lambda 3$, and $\lambda 4$.

Referring to a right graph of FIG. 6, the electronic device 1000 may display each of input data about a plurality of input second materials as shown in the graph. A plurality of circles displayed on the graph may correspond to the plural pieces of training data Data1, Data2, and Data3, respectively. The electronic device 1000 may determine dispersion values $\sigma 1$ and $\sigma 2$ for graphs of density of state for each energy level from the graph. The electronic device 1000 may determine the principal component vectors v1 and v2 for the graphs of density of state for each energy level based on the determined dispersion values $\sigma 1$ and $\sigma 2$. For example, the dispersion value $\sigma 2$ in a right upward direction of the graph is less than the dispersion value v1 in a left upward direction of the graph. Therefore, the electronic device 1000 may determine the principal component vector v1 in the right upward direction as a first principal component vector, and may determine the principal component vector v2 in the left upward direction as a second principal component vector. FIG. 6 shows the determination of two principal component vectors, but it is only for convenience of explanation and the present disclosure is not limited thereto.

According to an embodiment, the electronic device 1000 may determine a principal component vector for generating a graph of density of state for each energy level of the first material using the calculated at least one eigenvector and at least one eigenvalue. For example, the electronic device 1000 may determine an eigenvector having a higher priority in a descending order of eigenvalues from among the calculated eigenvectors as a principal component vector.

According to an embodiment, the electronic device 1000 may determine the number of principal component vectors for generating the graph of density of state for each energy level of the first material as a criterion for predicting the electronic structure of the first material. The number of principal component vectors may be determined based on plural pieces of data about a plurality of elements constituting the first material, but is not limited thereto. For example, the number of principal component vectors may be determined based on, but not limited to, the number of elements constituting the first material, the kind of elements, the number of atoms, the number of electrons, a chemical formula, an empirical formula, and the like. The number of principal component vectors may be determined based on, but not limited to, the data about the plurality of second materials input as training data.

For example, when the number of elements constituting the first material is two, the electronic device 1000 may determine the number of principal component vectors for generating the graph of density of state for each energy level of the first material as 2 to 4 based on the number of elements, the kinds of elements, the number of atoms, the number of electrons, the chemical formula, the empirical formula, and the like. The electronic device 1000 may determine a principal component vector corresponding to a dimension having a less dispersion value as a principal component vector for generating a graph of density of state for each energy level based on the determined number of principal component vectors.

According to an embodiment, the electronic device 1000 may determine a coefficient of the principal component vector as a criterion for predicting the electronic structure of the first material. The electronic device 1000 may determine a coefficient of at least one principal component vector that indicates a characteristic of the density of state for each energy level of the first material by comparing the generated graph of density of state for each energy level of the first material with graphs of density of state for energy level of the plurality of second materials included in the training data. The electronic device 1000 may determine the coefficients $\alpha_1$, $\alpha_2$, $\alpha_3$, and $\alpha_4$ of the principal component vectors PC1, PC2, PC3, and PC4, respectively, based on at least one of a d-orbital electron occupation rate of each of the plurality of elements constituting the first material, a coordination number of the first material, and a first mixing factor. The method of obtaining respective coefficients of principal component vectors will be described in detail later below with reference to FIGS. 9A to 9B.

Figure 7A:
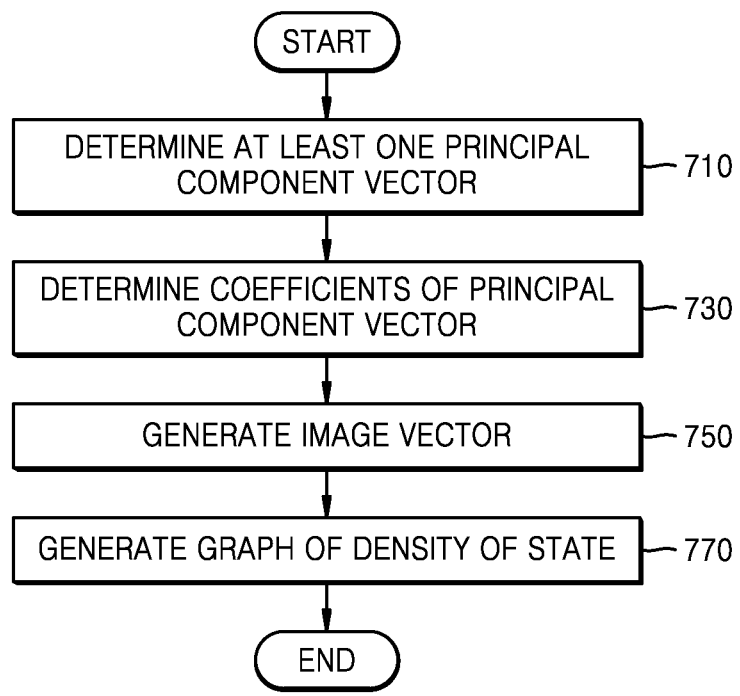
FIG. 7A is a flowchart of a method of generating a graph of density of state for each energy level of a material, according to an embodiment.
Figure 8:
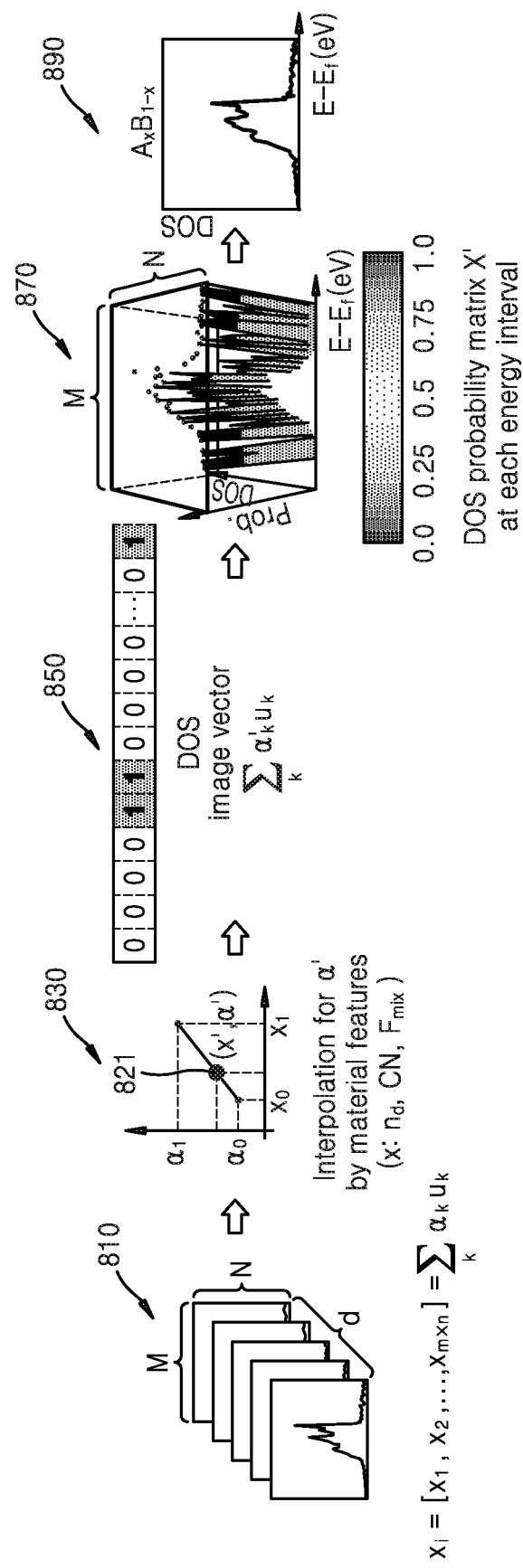
FIG. 8 is a conceptual diagram of a method of generating a graph of density of state for each energy level of a material, according to an embodiment.

FIG. 7A is a flowchart of a method of generating a graph of density of state for each energy level of a material, according to an embodiment, and FIG. 8 is a view of a method of generating a graph of density of state for each energy level of a material, according to an embodiment.

The electronic device 1000 may generate and output a graph of density of state for each energy level of a first material in order to predict an electronic structure of the first material.

Referring to operation 710, the electronic device 1000 may determine at least one principal component vector for generating the graph of density of state for each energy level of the first material. The electronic device 1000 may determine the at least one principal component vector by performing PCA on a plurality of matrices or a plurality of image vectors obtained by converting respective graphs of density of state for each energy level input as training data. The electronic device 1000 may calculate at least one eigenvector and at least one eigenvalue from a covariance matrix generated using the plurality of image vectors. The electronic device 1000 may determine the at least one principal component vector using the calculated eigenvectors and eigenvalues. A method for the electronic device 1000 to determine a principal component has been described above with reference to FIG. 6, and therefore, repeated descriptions thereof will not be given herein.

Referring to operation 730, the electronic device 1000 may determine coefficients of the at least one principal component vector determined in operation 710.

Here, a first coefficient is a coefficient for expressing a characteristic of the density of state for each energy level of the first material with respect to the at least one principal component vector determined in operation 710. Also, a second coefficient is a coefficient for expressing a characteristic of the density of state for each energy level of the second material with respect to the at least one principal component vector determined in operation 710. The first coefficient and the second coefficient are used only for distinguishing each other, and thus the present disclosure should not be limited thereto.

According to an embodiment, the electronic device 1000 may determine a first coefficient of the at least one principal component vector by applying data related to the first material received from a user to a trained model.

According to an embodiment, the electronic device 1000 may determine the first coefficient of the at least one principal component vector based on atomic structure information of the first material. Herein, the atomic structure information of the first material may include composition information indicating an electronic structure of each of a plurality of elements constituting the first material and crystal structure information indicating a crystal structure of the first material. The compositional information may include a d-orbital electron occupation rate ($n_d$). The crystal structure information may include a coordination number (CN) and a mixing factor ($F_{mix}$). The d-orbital electron occupation rate will be described in detail later below with reference to FIGS. 9A to 9B. A coordination number and a mixing factor will be described in detail later below with reference to FIG. 10A.

According to an embodiment, the electronic device 1000 may determine the second coefficient of the principal component vector determined in operation 710 from data about the second material input as training data. The electronic device 1000 may estimate a relationship between the determined second coefficient and composition information of the second material. The electronic device 1000 may estimate a relationship between the determined second coefficient and the crystal structure information of the second material. For example, referring to FIG. 8, the relationship between the second coefficient and the composition information of the second material may be estimated by a linear graph 830. Further, the relationship between the second coefficient and the crystal structure information of the second material may be estimated by the linear graph 830.

According to an embodiment, the electronic device 1000 may determine the first coefficient of the principal component vector from the estimated relationships. For example, referring to FIG. 8, the electronic device 1000 may determine a first coefficient $\alpha'$ by performing linear interpolation on the linear graph 830. In this case, the electronic device 1000 may determine the first coefficient $\alpha'$ based on second coefficients $\alpha_0$ and $\alpha_1$ for composition information $x_0$ and $x_1$ of second materials similar to composition information $x'$ of the first material in training data 810. The electronic device 1000 may estimate the second coefficients $\alpha_0$ and $\alpha_1$ for the composition information $x_0$ and $x_1$ of the second materials in the linear graph 830. The electronic device 1000 may determine the first coefficient $\alpha'$ corresponding to the composition information $x'$ of the first material by performing linear interpolation on the linear graph 830. The linear interpolation may also be applied to a method of determining a first coefficient corresponding to a crystal structure of a first material based on a relationship between crystal structure information of a second material and a second coefficient.

Figure 9A:
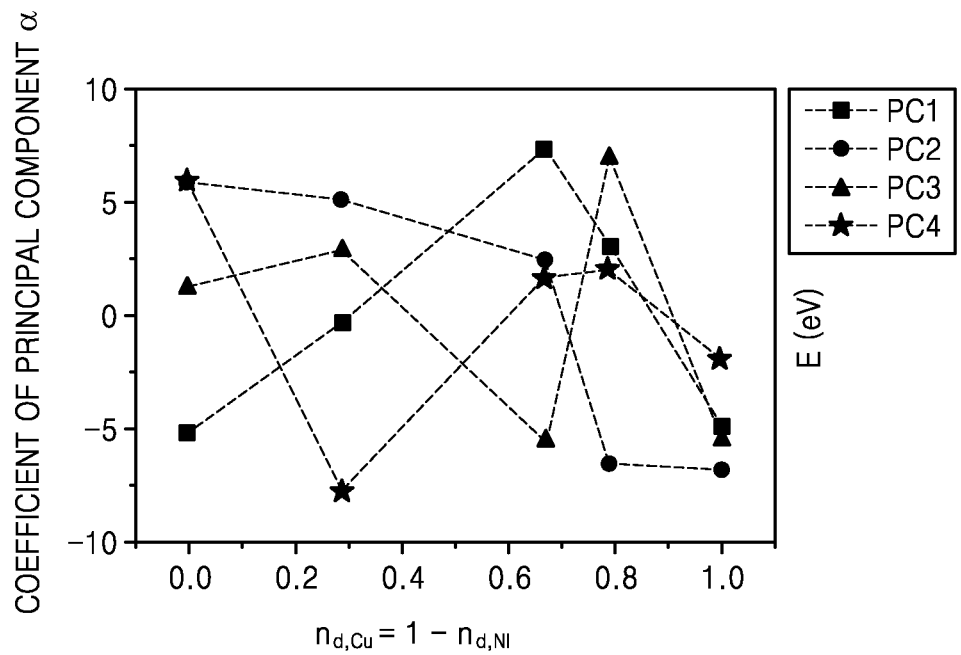
FIGS. 9A and 9B are graphs showing a relationship between a coefficient of a principal component and a d-orbital electron occupation rate, according to an embodiment.
Figure 9B:
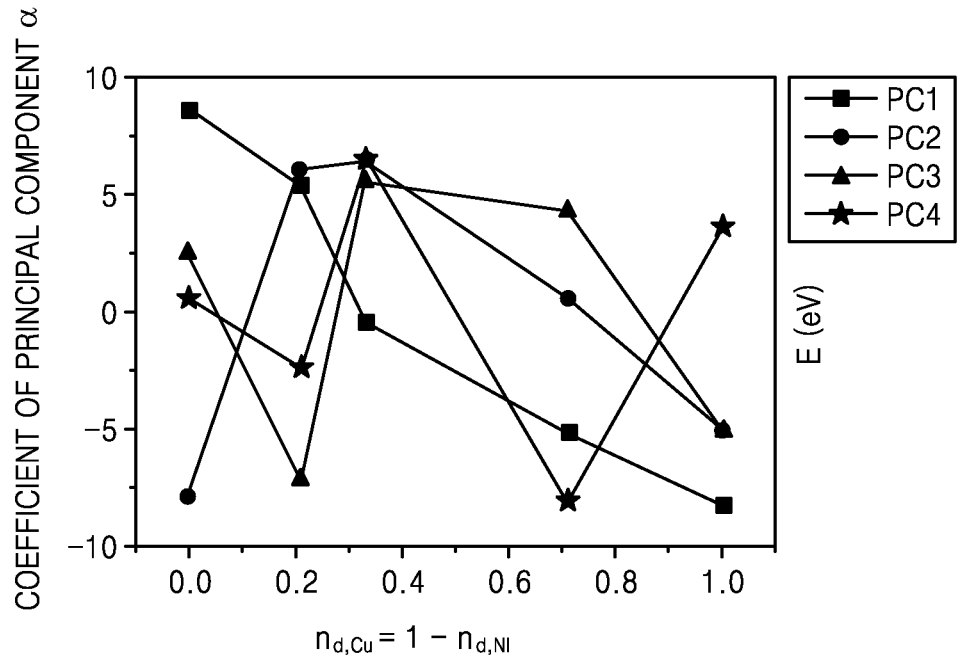

The electronic device 1000 may estimate a relationship between the d-orbital electron occupation rate ($n_d$) of each of the second materials and the second coefficients as a linear relationship as shown in FIGS. 9A and 9B.

Figures 10A, 10B:
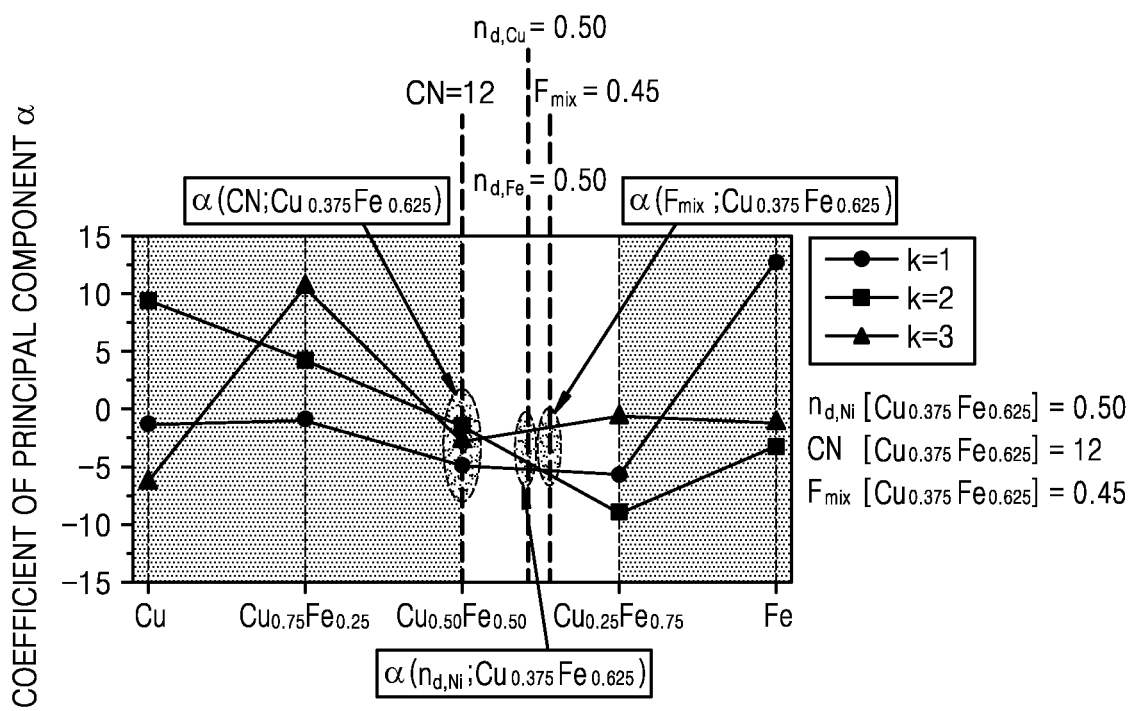
FIG. 10A is a table of a coordination number, a mixing factor, and a d-orbital electron occupation rate of elements corresponding to each of materials, according to an embodiment.
FIG. 10B is a graph of a relationship between a coefficient of a principal component and a d-orbital electron occupation rate, a coordination number, and a mixing factor, according to an embodiment.

The electronic device 1000 may also estimate a relationship between respective d-orbital electron occupation rates, respective coordination numbers, and respective mixing factors of the second materials and the second coefficients as a linear relationship as shown in FIG. 10B. The electronic device 1000 may determine a first coefficient corresponding to the d-orbital electron occupation rate of the first material, a first coefficient corresponding to the coordination number of the first material, and a first coefficient corresponding to the mixing factor of the first material, by performing linear interpolation on the estimated linear relationships.

According to an embodiment, the electronic device 1000 may determine a weight to be applied to each of composition information and crystal structure information. The electronic device 1000 may determine a weight to be applied to each of the composition information and the crystal structure information based on kinds of the elements constituting the first material. The electronic device 1000 may determine the first coefficient by applying the determined weight to each of the composition information and the crystal structure information.

For example, the electronic device 1000 may determine a weight to be applied to the d-orbital electron occupation rate of the first material, a weight to be applied to the coordination number of the first material, and a weight to be applied to the mixing factor of the first material.

Furthermore, the electronic device 1000 may determine a first coefficient to generate a graph of density of state for each energy level of the first material by linearly combining a first coefficient corresponding to the d-orbital electron occupation rate of the first material to which the weight is applied, a first coefficient corresponding to the coordination number of the first material, and a first coefficient corresponding to the mixing factor of the first material with each other.

The method of determining a coefficient of each of principal components by applying a weight to each of the composition information and the crystal structure information will be described in detail later below with reference to FIGS. 10A and 10B.

Referring to operation 750, the electronic device 1000 may generate an image vector 850 that represents density of state for each energy level of the first material based on the principal component vector determined in operation 710 and the coefficient of the principal component vector determined in operation 730.

According to an embodiment, the electronic device 1000 may generate the image vector 850 by linearly combining one or more principal component vectors and coefficients of the one or more principal component vectors, as shown in Equation 1. For example, when graphs of density of state for each energy level of a plurality of second materials received as training data are converted into the M×N (M and N are natural numbers) grid image 411, the first material image vector 850 may be generated in the form of a 1×L matrix (where L is the product of the natural number M and the natural number N).

According to an embodiment, the electronic device 1000 may store the generated image vector 850 in a temporary storage (e.g., random access memory (RAM)). Alternatively, the electronic device 1000 may store the generated image vector 850 in a non-transitory computer-readable recording medium (e.g., a data storage). The electronic device 1000 may generate a graph of density of state for each energy level of a first material using the stored image vector 850.

Referring to operation 770, the electronic device 1000 may generate a graph 890 of the density of state for each energy level of a first material as a criterion for predicting an electronic structure of the first material, based on the generated image vector 850.

According to an embodiment, the electronic device 1000 may convert the image vector 850 of the first material generated in operation 750 into a matrix. For example, the electronic device 1000 may convert the image vector 850 of the first material in the form of a 1×L matrix (where L is the product of the natural number M and the natural number N) into an M×N matrix. The electronic device 1000 may convert the image vector 850 of the first material into the M×N matrix by sequentially substituting values included in the 1×L matrix from an upper left component to a lower right component of the M×N matrix. Here, the matrix is density of state for each energy level of the first material.

According to an embodiment, the electronic device 1000 may generate a graph of density of state for each energy level of a first material by converting the M×N matrix into an M×N grid image. The electronic device 1000 may convert the M×N matrix into the M×N grid image by inputting respective data values input to entities of the M×N matrix into corresponding grids of the M×N grid image.

According to an embodiment, the electronic device 1000 may convert the M×N grid image into the graph 890 of the density of state for each energy level of the first material. For example, the electronic device 1000 may convert a grid having a data value of 0 from among the respective data values input to the grids of the M×N grid image into an area 892 where a function curve of the density of state for each energy level does not exist, and may convert a grid having a non-zero data value into an area 891 where a function curve of the density of state for each energy level exists.

According to an embodiment, the electronic device 1000 may convert the M×N matrix to an M×N probability matrix 870 and the M×N probability matrix 870 to the M×N grid image. The electronic device 1000 may remove negative data values of the respective data values input to the entities of the M×N matrix and generate an accurate graph of density of state for each energy level of the first material by converting the M×N matrix into the M×N probability matrix 870. The method of converting the M×N matrix into the M×N probability matrix by the electronic device 1000 will be described in detail later below with reference to FIG. 13.

Figure 7B:
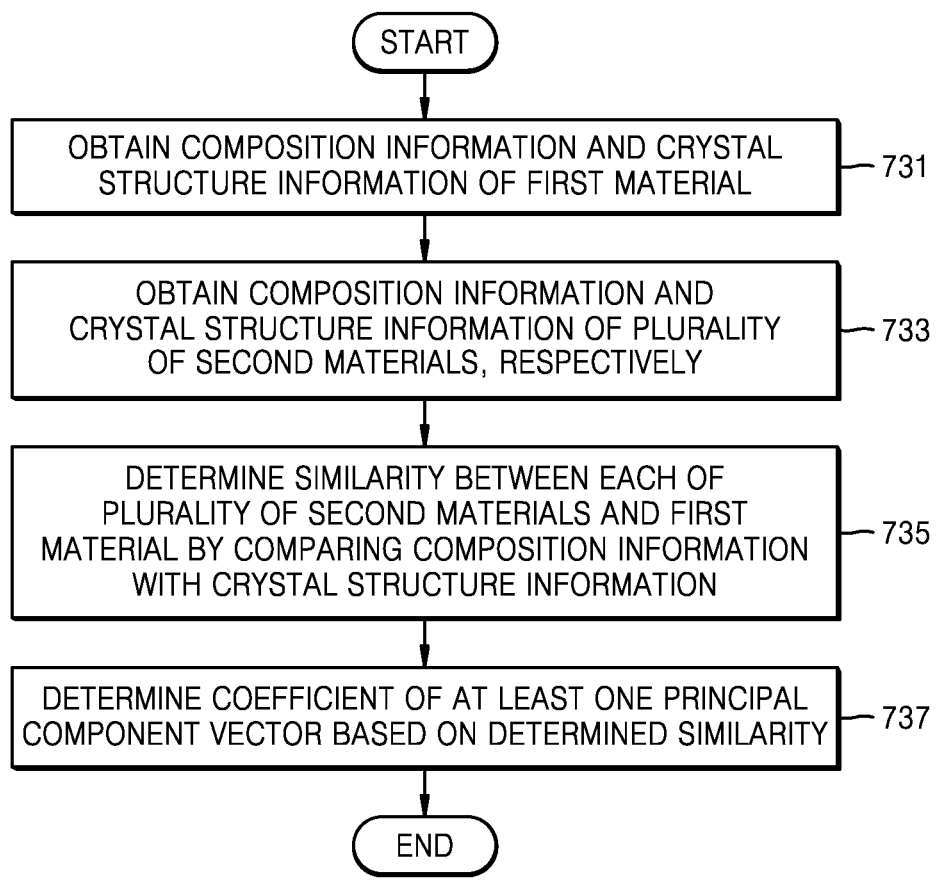
FIG. 7B is a flowchart of a method of determining a coefficient of a principal component vector to generate a graph of density of state for each energy level of a material, according to an embodiment.

FIG. 7B is a flowchart of a method of determining a coefficient of a principal component vector to generate a graph of density of state for each energy level of a material, according to an embodiment.

Referring to operation 731, the electronic device 1000 may obtain composition information and crystal structure information of a first material from input data received from a user. According to an embodiment, the composition information of the first material may include a d-orbital electron occupation rate ($n_d$) of each of elements constituting the first material. For example, the first material may be $[Cu_{0.03}Ni_{0.03}Pt_{0.94}]$ or $[Cu_{0.31}Ni_{0.31}Pt_{0.38}]$ which is a material composed of platinum (Pt), nickel (Ni), and copper (Cu). The composition information of the first material may include a d-orbital electron occupation rate ($n_{d,pt}$) of platinum, a d-orbital electron occupation rate ($n_{d,ni}$) of nickel, and a d-orbital electron occupation rate ($n_{d,cu}$) of copper. The d-orbital electron occupation rates will be described in detail later below with reference to FIGS. 9A to 9B.

According to an embodiment, the crystal structure information of the first material may include a coordination number (CN) and a mixing factor ($F_{mix}$). The coordination number and the mixing factor will be described in detail later below with reference to FIG. 10A.

Referring to operation 733, the electronic device 1000 may obtain composition information and crystal structure information of a plurality of second materials from training data, respectively.

According to an embodiment, the electronic device 1000 may obtain composition information and crystal structure information of each of the plurality of second materials from data about the plurality of second materials input to the training data. The electronic device 1000 may obtain the composition information and crystal structure information of each of the plurality of second materials similar to the first material.

For example, the electronic device 1000 may obtain the composition information and crystal structure information of each of the plurality of second materials $[Ni_{0.25}Pt_{0.75}]$, $[Cu_{0.25}Pt_{0.75}]$, and $[Pt]$ similar to a first material $[Cu_{0.03}Ni_{0.03}Pt_{0.94}]$. That is, the electronic device 1000 may obtain a d-orbital electron occupation rate of each of Ni and Pt constituting $[Ni_{0.25}Pt_{0.75}]$, and a coordination number and a mixing factor of $[Ni_{0.25}Pt_{0.75}]$. That is, the electronic device 1000 may obtain a d-orbital electron occupation rate of each of Ni and Pt constituting $[Ni_{0.25}Pt_{0.75}]$, and a coordination number and a mixing factor of $[Ni_{0.25}Pt_{0.75}]$. Furthermore, the electronic device 1000 may obtain a d-orbital electron occupation rate and a mixing factor of $[Pt]$ as 1 and may obtain a coordination number of $[Pt]$.

Referring to operation 735, the electronic device 1000 may determine the similarity between each of the plurality of second materials and the first material by comparing first composition information of the first material with second composition information of each of the plurality of second materials and comparing first crystal structure information of the first material with the second composition information of each of the plurality of second materials.

For example, the electronic device 1000 may compare composition information of the first material $[Cu_{0.03}Ni_{0.03}Pt_{0.94}]$ with composition information of each of the second materials $[Ni_{0.25}Pt_{0.75}]$, $[Cu_{0.25}Pt_{0.75}]$, and $[Pt]$. That is, the electronic device 1000 may compare a d-orbital electron occupation rate of each of platinum, nickel, and copper constituting the first material $[Cu_{0.03}Ni_{0.03}Pt_{0.94}]$ with a d-orbital electron occupation rate of platinum and nickel of the second material $[Ni_{0.25}Pt_{0.75}]$. Further, the electronic device 1000 may compare the d-orbital electron occupation rate of each of platinum, nickel, and copper constituting the first material $[Cu_{0.03}Ni_{0.03}Pt_{0.94}]$ with a d-orbital electron occupation rate of platinum and copper of the second material $[Cu_{0.25}Pt_{0.75}]$. Further, the electronic device 1000 may compare the d-orbital electron occupation rate of each of platinum, nickel, and copper constituting the first material $[Cu_{0.03}Ni_{0.03}Pt_{0.94}]$ with a d-orbital electron occupation rate of platinum of the second material $[Pt]$.

Also, the electronic device 1000 may compare the composition information of the first material $[Cu_{0.03}Ni_{0.03}Pt_{0.94}]$ with the composition information of each of the second materials $[Ni_{0.25}Pt_{0.75}]$, $[Cu_{0.25}Pt_{0.75}]$, and $[Pt]$. That is, the electronic device 1000 may compare a coordination number and a mixing factor of the first material $[Cu_{0.03}Ni_{0.03}Pt_{0.94}]$ with a coordination number and a mixing factor of the second material $[Ni_{0.25}Pt_{0.75}]$. That is, the electronic device 1000 may compare a coordination number and the mixing factor of the first material $[Cu_{0.03}Ni_{0.03}Pt_{0.94}]$ with a coordination number and a mixing factor of the second material $[Ni_{0.25}Pt_{0.75}]$. Also, the electronic device 1000 may compare the coordination number and the mixing factor of the first material $[Cu_{0.03}Ni_{0.03}Pt_{0.94}]$ with a coordination number and a mixing factor of the second material $[Pt]$.

According to an embodiment, the electronic device 1000 may determine the similarity between each of the plurality of second materials and the first material by comparing composition information of the first material with composition information of each of the plurality of second materials and comparing crystal structure information of the first material with crystal structure information of each of the plurality of second materials.

For example, the electronic device 1000 may determine a similarity between each of the plurality of second materials and the first material by linearly combining a square value of the difference between first composition information of the first material and second composition information of each of the plurality of second materials with a square value of the difference between first crystal structure information of the first material and second crystal structure information of each of the plurality of second materials.

The similarity between the first material and a third material, which is one of the plurality of second materials, may be determined as shown in Equation 2.

$$d_{i-j}=(n_{d,A}^i-n_{d,A}^j)^2+(n_{d,B}^i-n_{d,B}^j)^2+(n_{d,C}^i-n_{d,C}^j)^2+(CN_{norm}^i-CN_{norm}^j)^2+(F_{mix}^i-F_{mix}^j)^2 \quad \text{[Equation 2]}$$

Where i is an index indicating the first material, j is an index indicating the third material, and $d_{i-j}$ is the similarity between the first material and the third material. A, B, and C are elements constituting the first material. $n_{d,A}^i$ is a d-orbital electron occupation rate of the element A of the first material, $n_{d,A}^i$ is a d-orbital electron occupation rate of the element B of the first material, and $n_{d,C}^i$ is a d-orbital electron occupation rate of the element C of the first material. $n_{d,A}^j$ is a d-orbital electron occupation rate of the element A of the third material, $n_{d,B}^j$ is a d-orbital electron occupation rate of the element B of the third material, and $n_{d,C}^j$ is a d-orbital electron occupation rate of the element C of the third material. $F_{mix}^i$ is a mixing factor of the first material and $F_{mix}^j$ is a mixing factor of the third material. $CN_{NORM}^i$ is a value obtained by normalizing a coordination number of the first material and $CN_{NORM}^j$ is a value obtained by normalizing a coordination number of the third material. A coordination number of a material may be normalized by dividing the coordination number of the material by 12, which is a maximum coordination number.

In Equation 2, it is assumed that the number of elements constituting the first material is three. However, the number of elements constituting the first material may be four or more. That is, the similarity between the first material and a third material, which is one of the plurality of second materials, may be determined by finding a square value of the difference in the d-orbital electron occupation rates corresponding to the number of elements.

Referring to operation 737, the electronic device 1000 may determine a coefficient of at least one principal component vector based on the determined similarity.

According to an embodiment, the electronic device 1000 may determine a weight of each of the plurality of second materials based on the similarity between the first material and each of the plurality of second materials determined in operation 735.

For example, the electronic device 1000 may determine the weight of each of the plurality of second materials as shown in Equation 3.

$$w_{N-i} = \frac{\frac{1}{d_{N-i}}}{\frac{1}{d_{N-X}} + \frac{1}{d_{N-Y}} + \frac{1}{d_{N-Z}}} \quad \text{[Equation 3]}$$

Where each of X, Y, and Z is a third material from among the plurality of second materials, i is a third material to determine a weight from among the plurality of second materials X, Y, and Z, and $W_{N-i}$ is a weight of the determined third material. $d_{N-X}$ is the similarity between the first material and the second material X determined using Equation 2, $d_{N-Y}$ is the similarity between the first material and the second material Y determined using Equation 2, and $d_{N-Z}$ is the similarity between the first material and the second material Z determined using Equation 2.

That is, a denominator of a right side may be defined as the sum of reciprocals of the similarity between each of the plurality of second materials and the first material. Therefore, Equation 3 shows that the number of the plurality of second materials is three. However, the number of the plurality of second materials may be four or more.

According to an embodiment, the electronic device 1000 may determine a first coefficient of the first material by linearly combining the determined weights with a coefficient of a principal component vector of each of the plurality of second materials.

For example, the electronic device 1000 may determine the first coefficient of the first material as shown in Equation 4.

$$\alpha_N^k = w_{N-X} \alpha_X^k + w_{N-Y} \alpha_Y^k + w_{N-Z} \alpha_Z^k \quad \text{[Equation 4]}$$

Where k is an index of a principal component vector, $\alpha_X^k$ is a coefficient of a $k^{th}$ principal component vector of the second material X, $\alpha_Y^k$ is a coefficient of a $k^{th}$ principal component vector of the second material Y, and $\alpha_Z^k$ is a coefficient of a $k^{th}$ principal component vector of the second material Z. $w_{N-X}$ is a weight applied to the second material X, $w_{N-Y}$ is a weight applied to the second material Y, and $w_{N-Z}$ is a weight to be applied to the second material Z. $\alpha_N^k$ is the first coefficient of the first material.

Equation 4 shows that the number of the plurality of second materials is three. However, the number of the plurality of second materials may be four or more.

The electronic device 1000, based on the determined first coefficient of the first material, may generate an image vector of the first material and generate a graph of density of state for each energy level of the first material. Since the method of generating the image vector of the first material has been described in operation 750 of FIG. 7A, repeated descriptions thereof will not be given herein. Since the method of generating the graph of density of state for each energy level of the first material has been described in operation 770 of FIG. 7A, repeated descriptions thereof will not be given herein.

FIGS. 9A and 9B are graphs showing a relationship between a coefficient of a principal component vector and a d-orbital electron occupation rate, according to an embodiment. In more detail, FIG. 9A is a graph showing a relationship between a d-orbital electron occupation rate of Cu and a coefficient of each of four principal component vectors, and FIG. 9B is a graph showing a relationship between a d-orbital electron occupation rate of Ni and a coefficient of each of four principal component vectors.

According to an embodiment, the electronic device 1000 may determine the coefficient of the principal component vector based on composition information indicating an electronic structure of each of a plurality of elements constituting a material. The composition information may include a d-orbital electron occupation rate of each of the plurality of elements constituting the material.

The d-orbital electron occupation rate is a ratio occupied by the number of d-orbital electrons included in one element constituting the material from among the number of d-orbital electrons included in the material. For example, when elements constituting the material are A and B, the number of d-orbital electrons of A is a, the number of d-orbital electrons of B is b, an atomic number of A is x, and an atomic number of B is y, a d-orbital electron occupation rate $n_{d,A}[A_x B_y]$ of A in a material $[A_x B_y]$ may be calculated by the following Equation 5. Furthermore, a d-orbital electron occupation rates $n_{d,B}[A_x B_y]$ of B in the material $[A_x B_y]$ may be calculated by Equation 6.

$$n_{d,A}[A_x B_y] = \frac{a \cdot x/(x+y)}{a \cdot x/(x+y) + b \cdot y/(x+y)} \quad \text{[Equation 5]}$$

$$n_{d,B} = 1 - n_{d,A} \quad \text{[Equation 6]}$$

For example, when the element A is Cu and the element B is Ni, electronic arrangement of Cu is $[Ar]3d^{10}4s^1$ and electronic arrangement of Ni is $[Ar]3d^8 4s^2$. Therefore, the number of d-orbital electrons of Cu is 10 and the number of d-orbital electrons of Ni is 8. In a material $[Cu_{50}Ni_{50}]$ having an atomic number of Cu of 50 and an atomic number of Ni of 50, d-orbital electron occupation rates nd and Ni$[Cu_{50}Ni_{50}]$ of Cu are 0.67 and d-orbital electron occupation rates nd and Ni$[Cu_{50}Ni_{50}]$ of Ni are 0.33.

According to an embodiment, the electronic device 1000 may determine at least one principal component vector and a second coefficient of a principal component vector from data related to a plurality of second materials input as training data and a graph of density of state for each energy level of the plurality of second materials. The electronic device 1000 may obtain a d-orbital electron occupation rate, which is composition information of each of the plurality of second materials, from the data related to the plurality of second materials.

According to an embodiment, the electronic device 1000 may estimate a relationship between the d-orbital electron occupation rate of each of the plurality of second materials and the second coefficient of the principal component vector.

For example, referring to FIG. 9A, the electronic device 1000 may estimate a relationship between the d-orbital electron occupation rate ($n_{d,Cu}$) of Cu of each of the plurality of second materials composed of Cu and Ni and the second coefficient with a linear graph.

When the d-orbital electron occupation rate of Cu is 1, when the d-orbital electron occupation rate of Cu is 0.8, when the d-orbital electron occupation rate of Cu is 0.6, and when the d-orbital electron occupation rate of Cu is 0.3, the electronic device 1000 may determine a second coefficient of each of the principal component vectors corresponding to each case. The electronic device 1000 may estimate the relationship between the d-orbital electron occupation rate ($n_{d,Cu}$) of Cu and the second coefficient with a linear graph by connecting the determined second coefficients with a line.

Also, as shown in FIG. 9B, the electronic device 1000 may estimate a relationship between the d-orbital electron occupation rate ($n_{d,Ni}$) of Ni of each of the plurality of second materials composed of Cu and Ni and the second coefficient with a linear graph.

For example, referring to FIG. 9B, the electronic device 1000 may estimate the relationship between the d-orbital electron occupation rate ($n_{d,Ni}$) of Ni of each of the plurality of second materials composed of Cu and Ni and the second coefficient with a linear graph.

When the d-orbital electron occupation rate of Ni is 1, when the d-orbital electron occupation rate of Ni is 0.8, when the d-orbital electron occupation rate of Ni is 0.6, and when the d-orbital electron occupation rate of Ni is 0.3, the electronic device 1000 may determine the second coefficient of each of the principal component vectors corresponding to each case. The electronic device 1000 may estimate the relationship between the d-orbital electron occupation rate ($n_{d,Ni}$) of Ni and the second coefficient with a linear graph by connecting the determined second coefficients with a line. Referring to Equation 2, in the material composed of Cu and Ni, the d-orbital electron occupation rate ($n_{d,Ni}$) of Ni is opposite to the d-orbital electron occupation rated ($n_{d,Cu}$) of Cu. Therefore, a d-orbital electron occupation rate of each element constituting a material is a d-orbital electron occupation rate of the material.

Also, as shown in FIG. 9B, the electronic device 1000 may estimate the relationship between the d-orbital electron occupation rate ($n_{d,Ni}$) of Ni of each of the plurality of second materials composed of Cu and Ni and the second coefficient with a linear graph.

The electronic device 1000 may determine a first coefficient of the principal component vector from the estimated relationships. For example, the electronic device 1000 may determine a first coefficient corresponding to the d-orbital electron occupation rate of the first material by performing linear interpolation on the linear graph. Since the method by which the electronic device 1000 determines the first coefficient corresponding to the d-orbital electron occupation rate of the first material by performing the linear interpolation has been described above with reference to operation 730 of FIG. 7, repeated descriptions thereof will not be given herein.

When the first material is a complete solid solution, a first coefficient of an accurate principal component vector from a relationship between a d-orbital electron occupation rate of elements constituting the first material and a coefficient of the principal component vector.

FIG. 10A is a table of a coordination number, a mixing factor, and a d-orbital electron occupation rate of elements corresponding to each of materials, according to an embodiment. FIG. 10B is a graph of a relationship between a coefficient of a principal component and a d-orbital electron occupation rate, a coordination number, and a mixing factor, according to an embodiment.

There is a need to determine the coefficient of the principal component vector in consideration of crystal structure information, which is information related to a crystal structure of a material, and material composition information when the material is not a complete solid solution. The crystal structure information may include a coordination number and a mixing factor.

The coordination number (CN) is the average number of couplings in which one metal atom in a compound is coupled and is defined as a value obtained by dividing the number of all couplings between two elements constituting the material by the total number of atoms within a radius of a shared atom. A structure (e.g., the coordination number is 12 in the case of a face centered cubic (fcc) structure, and the coordination number is 8 in the case of a body centered cubic (bcc) structure) of the material may be determined according to the coordination number.

The mixing Factor ($F_{mix}$) is defined as a ratio of the total number of couplings between elements constituting the material and the number of couplings between the other elements. For example, in a material composed of the elements A and B, a ratio of the total number of couplings in which the number of couplings (A-A) between the element A and the element A, the number of couplings (A-B) between the element A and the element B, and the number of couplings (B-B) of the element B and the element B are all added is the mixing factor of the material. That is, the mixing factor approaches 1 as two elements constituting the material are well mixed, and the mixing factor approaches 0 as the two elements constituting the material are not mixed well. When the material is a pure metal composed of one element, the mixing factor is defined as zero.

Referring to FIG. 10A, the electronic device 1000 may obtain a coordination number of the first material, a mixing factor, and a d-orbital electron occupation rate for Cu and Fe, which are elements constituting the first material. For example, the electronic device 1000 may obtain a coordination number of a first material $[Cu_{0.375}Fe_{0.625}]$, a mixing factor, and the d-orbital electron occupation rate for Cu and Fe of the first material $[Cu_{0.375}Fe_{0.625}]$.

Referring to FIG. 10A, the electronic device 1000 may receive data related to a plurality of second materials from a user as training data. For example, the electronic device 1000 may receive data related to materials [Cu], $[Cu_{0.75}Fe_{0.25}]$, $[Cu_{0.5}Fe_{0.5}]$, $[Cu_{0.25}Fe_{0.75}]$, and [Fe]. The electronic device 1000 may receive a graph of density of state for each energy level of the materials [Cu], $[Cu_{0.75}Fe_{0.25}]$, $[Cu_{0.5}Fe_{0.5}]$, $[Cu_{0.25}Fe_{0.75}]$, and [Fe]. The electronic device 1000, from the received training data, may obtain a coordination number and a mixing factor of each of the materials [Cu], $[Cu_{0.75}Fe_{0.25}]$, $[Cu_{0.5}Fe_{0.5}]$, $[Cu_{0.25}Fe_{0.75}]$, and [Fe], and a d-orbital electron occupation rate for Cu and Fe in the materials.

Referring to FIG. 10B, the electronic device 1000 may estimate a relationship between the coordination number of each of the materials [Cu], $[Cu_{0.75}Fe_{0.25}]$, $[Cu_{0.5}Fe_{0.5}]$, $[Cu_{0.25}Fe_{0.75}]$, and [Fe] and a coefficient of the principal component vector. Furthermore, the electronic device 1000 may estimate a relationship between the mixing factor of each of the materials [Cu], $[Cu_{0.75}Fe_{0.25}]$, $[Cu_{0.5}Fe_{0.5}]$, $[Cu_{0.25}Fe_{0.75}]$, and [Fe] and the coefficient of the principal component vector. Furthermore, the electronic device 1000 may estimate a relationship between the d-orbital electron occupation rate for Cu and Fe of each of the materials [Cu], $[Cu_{0.75}Fe_{0.25}]$, $[Cu_{0.5}Fe_{0.5}]$, $[Cu_{0.25}Fe_{0.75}]$, and [Fe] and the coefficient of the principal component vector. The electronic device 1000 estimates each of the estimated relationships as a linear relationship, and may express the relationships as a linear graph.

Referring to FIG. 10B, the electronic device 1000 may determine a first coefficient corresponding to a d-orbital electron occupation rate of the first material $[Cu_{0.375}Fe_{0.625}]$ from the estimated relationship between the d-orbital electron occupation rate for Cu and Fe and the coefficient of the principal component vector. For example, the electronic device 1000, by performing linear interpolation on a linear graph of the d-orbital electron occupation rates for Cu and Fe and the coefficient of the principal component vector, may determine coefficients ($\alpha(n_{d,Cu})$, $\alpha(n_{d,Fe})$) of a principal component vector corresponding to d-orbital electron occupation rates ($n_{d.Cu}=0.5$, nhd d.Fe=0.5) for Cu and Fe of the first material.

Furthermore, the electronic device 1000 may determine the first coefficient corresponding to the coordination number of the first material from the estimated relationship between the coordination number and the coefficient of the principal component vector. For example, the electronic device 1000, by performing linear interpolation on a linear graph of the coordination number and the coefficient of the principal component vector, may determine a coefficient ($\alpha(CN)$) of a principal component vector corresponding to a coordination number CN=12 of the first material.

Furthermore, the electronic device 1000 may determine the first coefficient corresponding to the mixing factor of the first material from the estimated relationship between the mixing factor and the coefficient of the principal component vector. For example, the electronic device 1000, by performing linear interpolation on a linear graph for the estimated relationship between the mixing factor and the coefficient of the principal component vector, may determine a coefficient ($\alpha(F_{mix})$) of a principal component vector corresponding to a mixing factor ($F_{mix}=0.45$) of the first material.

According to an embodiment, the electronic device 1000 may determine the first coefficient by performing linear interpolation on a linear graph for the plurality of second materials similar to the first material. For example, the electronic device 1000, by performing linear interpolation on a linear graph for second materials [$Cu_{0.5}Fe_{0.5}$] and [$Cu_{0.25}Fe_{0.75}$] similar to the first material [$Cu_{0.375}Fe_{0.625}$], may determine a first coefficient ($\alpha(n_{d.Fe})$) corresponding to the d-orbital electron occupation rate of the first material [$Cu_{0.375}Fe_{0.625}$], a first coefficient ($\alpha(CN)$) corresponding to a coordination number of the first material [$Cu_{0.375}Fe_{0.625}$], and a first coefficient ($\alpha(F_{mix})$) corresponding to a mixing factor of the first material [$Cu_{0.375}Fe_{0.625}$].

In more detail, the electronic device 1000 may determine the first coefficient ($\alpha(CN)$) corresponding to the coordination number of the first material [$Cu_{0.375}Fe_{0.625}$] by linearly connecting the coefficient of the principal component vector corresponding to the coordination number of the second material [$Cu_{0.5}Fe_{0.5}$] to the coefficient of the principal component vector corresponding to a coordination number of [$Cu_{0.25}Fe_{0.75}$] and by performing linear interpolation.

Further, the electronic device 1000 may determine the first coefficient ($\alpha(F_{mix})$) corresponding to the mixing factor of the first material [$Cu_{0.375}Fe_{0.625}$] by linearly connecting the coefficient of the principal component vector corresponding to a mixing factor of the second material [$Cu_{0.5}Fe_{0.5}$] to the coefficient of the principal component vector corresponding to a mixing factor of [$Cu_{0.25}Fe_{0.75}$] and by performing linear interpolation.

Further, the electronic device 1000 may determine the first coefficient ($\alpha(n_{d.Fe})$) corresponding to the d-orbital electron occupation rate of the first material [$Cu_{0.375}Fe_{0.625}$] by linearly connecting the coefficient of the principal component vector corresponding to a d-orbital electron occupation rate of the second material [$Cu_{0.5}Fe_{0.5}$] to the coefficient of the principal component vector corresponding to a d-orbital electron occupation rate of [$Cu_{0.25}Fe_{0.75}$] and by performing linear interpolation.

According to an embodiment, the electronic device 1000 may determine a first coefficient ($\alpha$) of the first material based on the first coefficient ($\alpha(n_{d.Fe})$) corresponding to the d-orbital electron occupation rate of the first material, the first coefficient ($\alpha(CN)$) corresponding to the coordination number of the first material, and the first coefficient ($\alpha(F_{mix})$) corresponding to the mixing factor of the first material.

For example, the electronic device 1000 may determine the first coefficient ($\alpha$) of the first material as shown in Equation 7 by applying a weight to each of the first coefficient ($\alpha(n_{d.Fe})$) corresponding to the d-orbital electron occupation rate of the first material, the first coefficient ($\alpha(CN)$) corresponding to the coordination number of the first material, and the first coefficient ($\alpha(F_{mix})$) corresponding to the mixing factor of the first material and performing linear combination.

$$\alpha_k = w1 \cdot \alpha_k(n_{d.Fe}) + w2 \cdot \alpha_k(CN) + w3 \cdot \alpha_k(F_{mix}) \quad \text{[Equation 7]}$$

where k is a natural number equal to or greater than 1, which means an index of the principal component vector. That is, $\alpha_k$ is a $k^{th}$ principal component vector. w1 is a weight applied to the first coefficient ($\alpha(n_{d.Fe})$) corresponding to the d-orbital electron occupation rate, w2 is a weight applied to the first coefficient($\alpha(CN)$) corresponding to the coordination number, and w3 is a weight applied to the first coefficient ($\alpha(F_{mix})$) corresponding to the mixing factor. The sum of w1, w2, and w3 is 1.

For example, the electronic device may determine the weights w1, w2 and w3 to ⅓, which is the same value, and may determine the first coefficient ($\alpha$) of the first material by respectively applying the weights w1, w2 and w3 to of the first coefficient ($\alpha(n_{d.Fe})$) corresponding to the d-orbital electron occupation rate, the second coefficient ($\alpha(CN)$) corresponding to the coordination number, and the third coefficient ($\alpha(F_{mix})$) corresponding to the mixing factor and performing linear combination.

Figure 11:
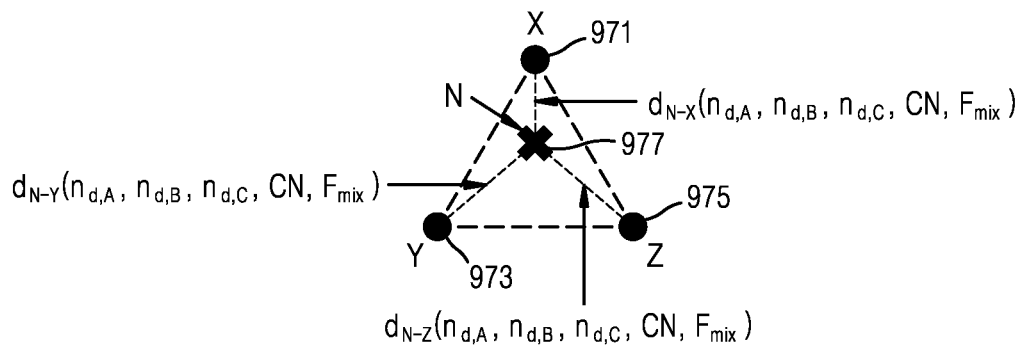
FIG. 11 is a view of the similarity of materials composed of at least one of a material for predicting an electronic structure and elements constituting the material, according to an embodiment.
Figure 12A:
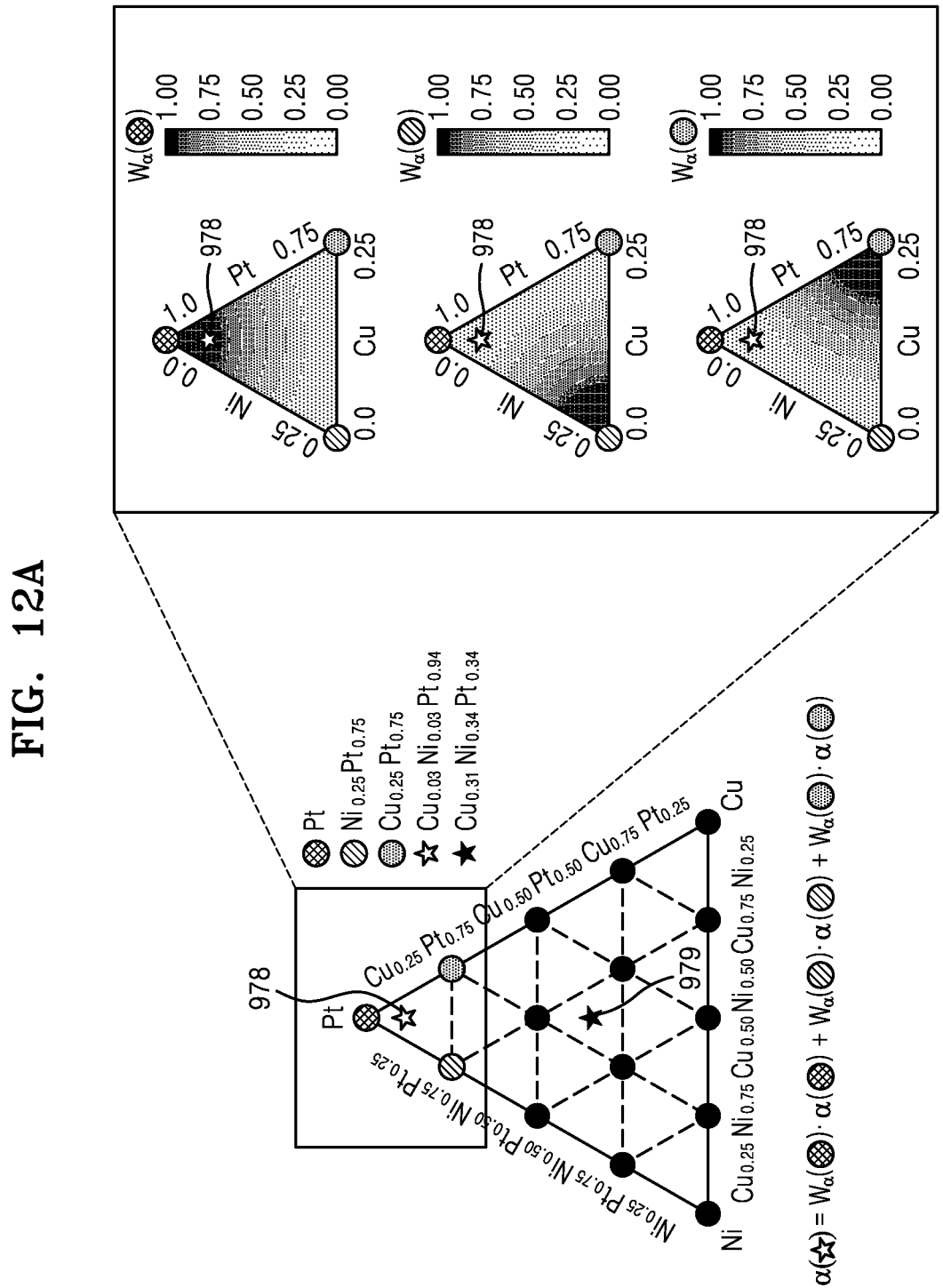
FIG. 12A is a view of a method of determining a coefficient of a principal component vector based on the similarity of materials composed of at least one of a material for predicting an electronic structure and elements constituting the material, according to an embodiment.

FIG. 11 is a view of the similarity of materials composed of at least one of a material for predicting an electronic structure and elements constituting the material, according to an embodiment, FIG. 12A is a view of a method of determining a coefficient of a principal component vector based on the similarity of materials composed of at least one of a material for predicting an electronic structure and elements constituting the material, according to an embodiment, and FIG. 12B is a table of a coordination number, a mixing factor, and a d-orbital electron occupation rate of elements corresponding to each of materials, according to an embodiment.

Referring to FIG. 11, a first material 977 for predicting the electronic structure may include at least three elements. Also, the electronic device 1000 may receive data about a plurality of second materials 971, 973, and 975, which include at least one of the elements constituting the first material 977, as training data. The electronic device 1000 may obtain composition information and crystal structure information of the first material 977 from the data about the first material 977 received from a user. The electronic device 1000 may obtain the composition information and crystal structure information of each of the plurality of second materials from the training data. The plurality of second materials 971, 973, and 975 may correspond to materials most similar to the first material 977 from among the training data. The electronic device 1000 may determine similarities $d_{n-x}$, $d_{n-y}$, and $d_{n-z}$ of the first material 977 and the plurality of second materials 971, 973, and 975, respectively.

For example, the first material 977 may be a material including the elements [A], [B], and [C]. The plurality of second materials 971, 973, and 975 may be materials including at least one of the elements [A], [B], and [C], respectively.

The electronic device 1000 may obtain a d-orbital electron occupation rate ($n_{d,A}$) of the element [A] of the first material, a d-orbital electron occupation rate ($n_{d,B}$) of the element [B] of the first material, a d-orbital electron occupation rate ($n_{d,C}$) of the element [C] of the first material, a coordination number of the first material, and a mixing factor of the first material from the pieces of data related to the first material received from a user.

For example, referring to FIGS. 12A and 12B, the electronic device 1000 may obtain the d-orbital electron occupation rate ($n_{d,pt}$) of platinum, the d-orbital electron occupation rate ($n_{d,ni}$) of nickel, and the d-orbital electron occupation rate ($n_{d,Cu}$) of copper of the first material [$Cu_{0.03}Ni_{0.03}Pt_{0.94}$]. Also, the electronic device 1000 may obtain a coordination number and a mixing factor of the first material [$Cu_{0.03}Ni_{0.03}Pt_{0.94}$].

For example, referring to FIG. 12B, the electronic device 1000 may obtain a d-orbital electron occupation rate of each of elements constituting each of the plurality of second materials 971, 973, and 975, a coordination number of each of the plurality of second materials 971, 973, and 975, and a mixing factor of each of the plurality of second materials 971, 973, and 975.

For example, referring to FIG. 12B, the electronic device 1000 may obtain the composition information and crystal structure information of each of the plurality of second materials [$Ni_{0.25}Pt_{0.75}$], [$Cu_{0.25}Pt_{0.75}$], and [Pt] similar to the first material [$Cu_{0.03}Ni_{0.03}Pt_{0.94}$]. That is, the electronic device 1000 may obtain a d-orbital electron occupation rate of each of Ni and Pt constituting [$Ni_{0.25}Pt_{0.75}$], and a coordination number and a mixing factor of [$Ni_{0.25}Pt_{0.75}$]. That is, the electronic device 1000 may obtain a d-orbital electron occupation rate of each of Ni and Pt constituting [$Ni_{0.25}Pt_{0.75}$], and a coordination number and a mixing factor of [$Ni_{0.25}Pt_{0.75}$]. Furthermore, the electronic device 1000 may obtain a d-orbital electron occupation rate and a mixing factor of [Pt] as 1 and may obtain a coordination number of [Pt].

The electronic device 1000 may determine the similarities $d_{n-x}$, $d_{n-y}$, and $d_{n-z}$ between each of the plurality of second materials 971, 973, and 975 and the first material by comparing first composition information of the first material with second composition information of each of the plurality of second materials and comparing the first crystal structure information of the first material with the second composition information of each of the plurality of second materials 971, 973, and 975.

The electronic device 1000 may compare the d-orbital electron occupation rate ($n_{d,A}$) of the element [A] of the first material, the d-orbital electron occupation rate ($n_{d,B}$) of the element [B] of the first material, and the d-orbital electron occupation rate ($n_{d,C}$) of the element [C] of the first material with the d-orbital electron occupation rate ($n_{d,A}$) of the element [A] constituting a third material, which is one of the plurality of second materials, the d-orbital electron occupation rate ($n_{d,B}$) of the element [B] of the third material, and the d-orbital electron occupation rate ($n_{d,C}$) of the element [C] of the third material. The electronic device 1000 may compare the coordination number of the first material with the coordination number of the third material. The electronic device 1000 may compare the mixing coefficient of the first material with the mixing factor of the third material.

For example, referring to FIG. 12A, the electronic device 1000 may compare the composition information of the first material [$Cu_{0.03}Ni_{0.03}Pt_{0.94}$] with the composition information of each of the second materials [$Ni_{0.25}Pt_{0.75}$], [$Cu_{0.25}Pt_{0.75}$], and [Pt]. That is, the electronic device 1000 may compare a d-orbital electron occupation rate of each of platinum, nickel, and copper constituting the first material [$Cu_{0.03}Ni_{0.03}Pt_{0.94}$] with a d-orbital electron occupation rate of platinum and nickel of the second material [$Ni_{0.25}Pt_{0.75}$]. Further, the electronic device 1000 may compare the d-orbital electron occupation rate of each of platinum, nickel, and copper constituting the first material [$Cu_{0.03}Ni_{0.03}Pt_{0.94}$] with a d-orbital electron occupation rate of platinum and copper of the second material [$Cu_{0.25}Pt_{0.75}$]. Further, the electronic device 1000 may compare the d-orbital electron occupation rate of each of platinum, nickel, and copper constituting the first material [$Cu_{0.03}Ni_{0.03}Pt_{0.94}$] with a d-orbital electron occupation rate of platinum of the second material [Pt].

Also, the electronic device 1000 may compare the composition information of the first material [$Cu_{0.03}Ni_{0.03}Pt_{0.94}$] with the composition information of each of the second materials [$Ni_{0.25}Pt_{0.75}$], [$Cu_{0.25}Pt_{0.75}$], and [Pt]. That is, the electronic device 1000 may compare the coordination number and the mixing factor of the first material [$Cu_{0.03}Ni_{0.03}Pt_{0.94}$] with a coordination number and a mixing factor of the second material [$Ni_{0.25}Pt_{0.75}$]. That is, the electronic device 1000 may compare the coordination number and the mixing factor of the first material [$Cu_{0.03}Ni_{0.03}Pt_{0.94}$] with a coordination number and a mixing factor of the second material [$Ni_{0.25}Pt_{0.75}$]. Also, the electronic device 1000 may compare the coordination number and the mixing factor of the first material [$Cu_{0.03}Ni_{0.03}Pt_{0.94}$] with a coordination number and a mixing factor of the second material [Pt].

The electronic device 1000, based on a result of the comparing, may determine the similarities $d_{n-x}$, $d_{n-y}$, and $d_{n-z}$ of the first material 977 and the plurality of second materials 971, 973, and 975, respectively. The similarity between the first material 977 and a third material, which is one of the plurality of second materials 971, 973, and 975, may be determined as shown in Equation 2 above.

Referring to FIG. 12A, the electronic device 1000 may generate a graph of density of state for each energy level in order to predict an electronic structure of the first material. The electronic device 1000 may determine a first coefficient, which is a coefficient of a principal component vector of the first material, to generate the graph of density of state for each energy level of the first material. The electronic device 1000 may determine similarities of the plurality of second materials and the first material to determine the first coefficient.

For example, the electronic device 1000 may determine the similarity of the first material [$Cu_{0.03}Ni_{0.03}Pt_{0.94}$] and a third material [$Ni_{0.25}Pt_{0.75}$] from among the plurality of second materials using Equation 2. In Equation 2, the element A may be Cu, the element B may be Ni, and the element C may be Pt.

In more detail, the electronic device 1000 may obtain a square value of a difference between a d-orbital electron occupation rate of Cu of the first material [$Cu_{0.03}Ni_{0.03}Pt_{0.94}$] and a d-orbital electron occupation rate of Cu of the third material [$Ni_{0.25}Pt_{0.75}$]. The electronic device 1000 may obtain a square value of a difference between a d-orbital electron occupation rate of Ni of the first material [$Cu_{0.03}Ni_{0.03}Pt_{0.94}$] and a d-orbital electron occupation rate of Ni of the third material [$Ni_{0.25}Pt_{0.75}$]. The electronic device 1000 may obtain a square value of a difference between a d-orbital electron occupation rate of Pt of the first material [$Cu_{0.03}Ni_{0.03}Pt_{0.94}$] and a d-orbital electron occupation rate of Pt of the third material [$Ni_{0.25}Pt_{0.75}$]. The electronic device 1000 may obtain a square value of a difference between a normalized coordination number of the first material [$Cu_{0.03}Ni_{0.03}Pt_{0.94}$] and a normalized coordination number of the third material [$Ni_{0.25}Pt_{0.75}$]. The electronic device 1000 may obtain a square value of the mixing factor of the first material [$Cu_{0.03}Ni_{0.03}Pt_{0.94}$] and a mixing factor of the third material [$Ni_{0.25}Pt_{0.75}$]. The electronic device 1000 may determine a similarity between the first material [$Cu_{0.03}Ni_{0.03}Pt_{0.94}$] and the third material [$Ni_{0.25}Pt_{0.75}$] by linearly combining the obtained squared values.

Similarly, the electronic device 1000 may determine a similarity between the first material [$Cu_{0.03}Ni_{0.03}Pt_{0.94}$] and the third material [$Cu_{0.25}Pt_{0.75}$] from among the plurality of second materials. Furthermore, the electronic device 1000 may determine a similarity between the first material [$Cu_{0.03}Ni_{0.03}Pt_{0.94}$] and the third material [Pt] from among the plurality of second materials.

Referring to FIG. 12A, the electronic device 1000 may determine the first coefficient based on the determined similarities. The electronic device 1000 may determine a weight of each of the plurality of second materials as shown in Equation 3. That is, the weight of the third material from among the plurality of second materials may be determined as a value obtained by dividing a reciprocal of a similarity between the third material and the first material by the sum of reciprocals of a similarity between the each of the plurality of second materials and the first material.

For example, the electronic device 1000 may be determined based on a first similarity between the first material [$Cu_{0.03}Ni_{0.03}Pt_{0.94}$] and the third material [$Ni_{0.25}Pt_{0.75}$], a second similarity between the first material [$Cu_{0.03}Ni_{0.03}Pt_{0.94}$] and the third material [$Cu_{0.25}Pt_{0.75}$], and a third similarity between the first material [$Cu_{0.03}Ni_{0.03}Pt_{0.94}$] and the third material [Pt].

A first weight of the third material [$Ni_{0.25}Pt_{0.75}$] may be a value obtained by dividing a reciprocal of the first similarity by the sum of respective reciprocals of the first similarity, the second similarity, and the third similarity. A second weight of the third material [$Cu_{0.25}Pt_{0.75}$] may be a value obtained by dividing a reciprocal of the second similarity by the sum of respective reciprocals of the first similarity, the second similarity, and the third similarity. A third weight of the third material [Pt] may be a value obtained by dividing a reciprocal of the third similarity by the sum of respective reciprocals of the first similarity, the second similarity, and the third similarity.

The electronic device 1000 may determine the first coefficient based on a weight of each of the plurality of second materials as shown in Equation 4. The electronic device 1000 may determine a first coefficient of the first material by linearly combining the determined weights with a coefficient of a principal component vector of each of the plurality of second materials.

For example, the electronic device 1000 may determine the first first coefficient as the sum of a value obtained by multiplying the first weight by a coefficient of the first principal component vector of the second material [$Ni_{0.25}Pt_{0.75}$], a value obtained by multiplying the second weight by the coefficient of the first principal component vector of the second material [$Cu_{0.25}Pt_{0.75}$], and a value obtained by multiplying the third weight by the coefficient of the first principal component vector of the second material [Pt]. The electronic device 1000 may also similarly determine the second to $k^{th}$ first coefficient.

The electronic device 1000, based on the determined first coefficient of the first material, may generate an image vector of the first material and generate a graph of density of state for each energy level of the first material. Since the method of generating the image vector of the first material has been described in operation 750 of FIG. 7A, repeated descriptions thereof will not be given herein. Since the method of generating the graph of density of state for each energy level of the first material has been described in operation 770 of FIG. 7A, repeated descriptions thereof will not be given herein.

Figure 13:
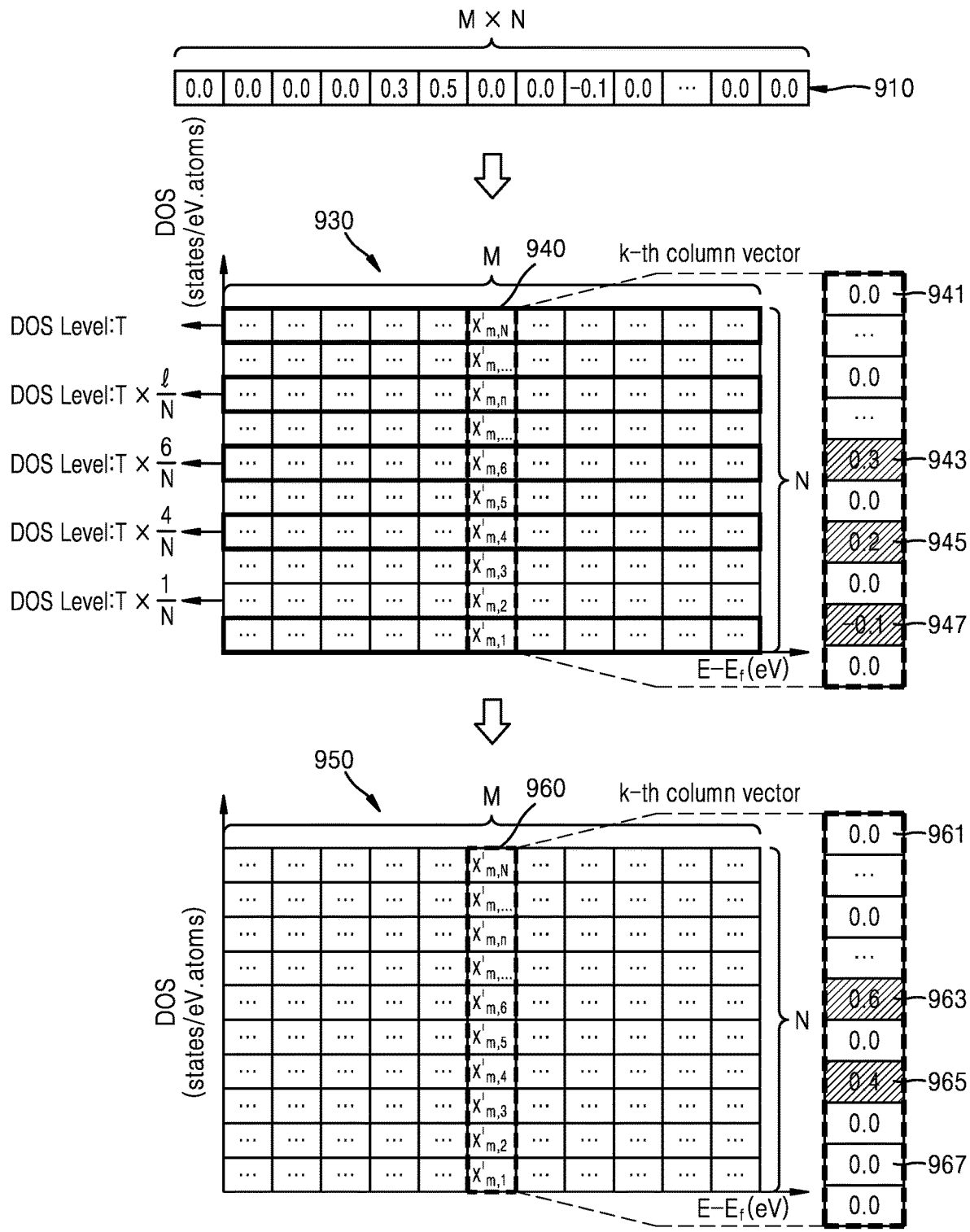
FIG. 13 is a view of a probability matrix for estimating a graph of density of state for each energy level of a material, according to an embodiment.

FIG. 13 is a view of a probability matrix for estimating a graph of density of state for each energy level of a material, according to an embodiment.

Referring to FIG. 13, the electronic device 1000 may convert an image vector 910 representing the density of state for each energy level of a first material into a matrix 930. For example, the electronic device 1000 may convert the image vector 910 generated in the form of a 1×L matrix (where L is the product of the natural number M and the natural number N) into the M×N matrix 930.

A $k^{th}$ column 940 of the M×N matrix 930 may include N entities, and each component may include data showing density of state of the first material. For example, the $k^{th}$ column 940 may include a component 941 that includes a data value of 0, and components 943, 945, 947 that contain a non-zero data value. Here, there may be a component 947 including a negative data value.

In order for a matrix to be converted into a grid image, data included in each element of the matrix needs to be a positive data value. Therefore, the negative data value included in the component of the matrix needs to be removed. The electronic device 1000 may remove the negative data value from the component including the negative data value by converting the M×N matrix 930 into a M×N probability matrix 950.

The data value included in the component of the M×N probability matrix 950 may be defined by Equation 5. Also, a component of the M×N matrix 930 including zero and negative data values may be converted into a component of the M×N probability matrix 950 including the data value of zero.

$$X'_{k,l}(p) = \frac{x'_{k,l}}{\sum_l x'_{k,l}} \qquad \text{[Equation 8]}$$

where k is a $k^{th}$ row, l is an $l^{th}$ column, and $X'_{k,l}$ is a positive data value included in a component of the $k^{th}$ row and the $l^{th}$ column.

Referring to FIG. 13, according to Equation 8, a component 943 including a data value of 0.3 from among the components of the M×N matrix 930 may be converted into a component 963 of the M×N probability matrix 950 including a data value of 0.6 (=0.3/(0.3+0.2). In addition, a component 945 including a data value of 0.2 from among the components of the M×N matrix 930 may be converted into a component 965 of the M×N probability matrix 950 including a data value of 0.4(=0.2/(0.3+0.2)). Furthermore, a component 94 including a negative data value from among the components of the M×N matrix 930 may be converted into a component 967 of the M×N probability matrix 950 including a data value of zero.

According to an embodiment, the electronic device 1000 may estimate density of state for each energy level of a material using an M×N probability matrix. For example, the electronic device 1000, as shown in Equation 9, may estimate a value of the density of state for a $k^{th}$ energy level by multiplying the M×N probability matrix and an $l^{th}$ density of state for the $k^{th}$ energy level.

$$DOS'(E_k) = X'_{k,l}(p) \times DOS_l(E_k))$$ [Equation 9]

$X'_{k,l}(p)$ is an M×N probability matrix, $DOS_l(E_k)$ is an $l^{th}$ value of the density of state for the $k^{th}$ energy level, and $DOS'(E_k)$ is a value of the density of state for the $k^{th}$ energy level. $DOS_l(E_k)$ may be defined as shown in Equation 10.

$$DOS_l(E_k) = lT/N$$ [Equation 10]

where N is the number of rows of the matrix and T is a maximum density of state value.

For example, in a 100×100 matrix, when the maximum density of state value T is 3, the electronic device 1000 may estimate the value of the density of state for the $k^{th}$ energy level as 0.156 (=0.6×(6×3/100)+0.4×4×3/100)). The electronic device 1000 may estimate values of the density of state for first to $M^{th}$ energy levels, respectively.

According to an embodiment, the electronic device 1000, based on the estimated values of the density of state for the first to Mth energy levels, may generate a graph of density of state for each energy level for a material to predict an electronic structure. For example, the electronic device 1000 may display a value of the density of state corresponding to each energy level on a graph and connect the values to each other to generate a graph of density of state for each energy level.

According to an embodiment, the electronic device 1000 may output the generated graph of density of state for each energy level as shown in FIGS. 14A to 14F.

FIGS. 14A to 14F are a graph of density of state for each energy level estimated using a trained model and a graph of density of state for each energy level estimated according to a DFT, according to an embodiment.

The electronic device 1000 may receive data about each of a plurality of second materials [Cu], [$Cu_{0.75}Ni_{0.25}$], [$Cu_{0.50}Ni_{0.50}$], [$Cu_{0.25}Ni_{0.75}$], and [Ni], wherein Cu and Ni are composed of a face-centered cubic (FCC) structure, and the graphs of density of state for each energy level as training data, from a user. The electronic device 1000 may convert the received training data into feature data. The electronic device 1000 may determine at least one principal component vector of a material composed of Cu and Ni by applying the feature data to a trained model. The electronic device 1000 may determine a first coefficient of the at least one principal component vector. The electronic device 1000 may generate a graph of density of state for each energy level of a first material using the determined at least one principal component vector and first coefficient of the at least one principal component vector. The electronic device 1000 may output the generated graph of density of state for each energy level of the first material.

For example, the electronic device 1000, when applying data related to elements constituting a material [$Cu_{20}Ni_{12}$] to a trained model, may output a graph of density of state for each energy level of the estimated material [$Cu_{20}Ni_{12}$] from the trained model. For example, the electronic device 1000, when applying data related to elements constituting a material [$Cu_{12}Ni_{20}$] to a trained model, may output a graph of density of state for each energy level of the estimated material [$Cu_{12}Ni_{20}$] from the trained model.

Figure 14A:
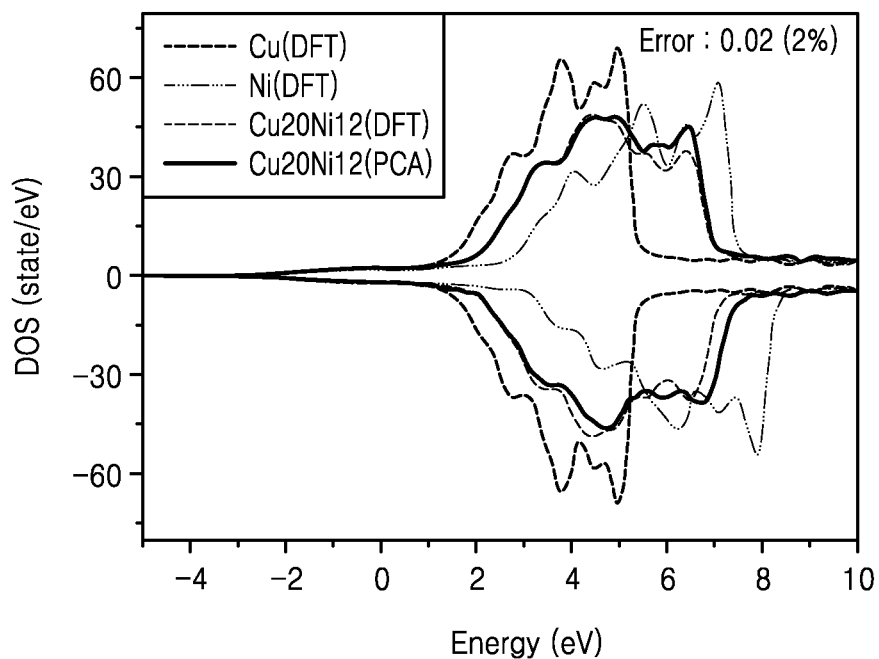
FIGS. 14A to 14F are a graph of density of state for each energy level estimated using a trained model and a graph of density of state for each energy level estimated according to a density functional theory (DFT), according to an embodiment.

Referring to FIG. 14A, a graph of density of state for each energy level of the material [$Cu_{20}Ni_{12}$], which is estimated by applying data related to the elements constituting the material [$Cu_{20}Ni_{12}$] to a trained model, matches approximately 95% of a graph of density of state for each energy level of the material [$Cu_{20}Ni_{12}$] that is estimated using a DFT. The graph of density of state for each energy level, which is estimated by applying the data related to the elements constituting the material [$Cu_{20}Ni_{12}$] to the trained model, is output in 3 minutes, but the graph of density of state for each energy level of the material [$Cu_{20}Ni_{12}$] that is estimated using DFT is output in 49 hours.

Figure 14B:
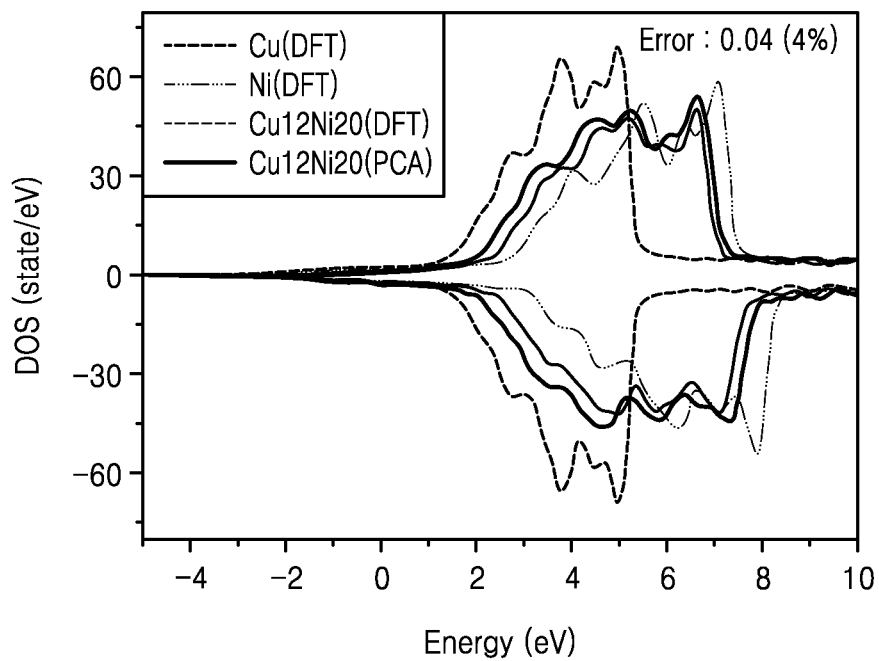

Referring to FIG. 14B, a graph of density of state for each energy level of the material [$Cu_{12}Ni_{20}$], which is estimated by applying data related to the elements constituting the material [$Cu_{12}Ni_{20}$] to a trained model, matches approximately 96% of a graph of density of state for each energy level of the material [$Cu_{12}Ni_{20}$] that is estimated using DFT. The graph of density of state for each energy level, which is estimated by applying the data related to the elements constituting the material [$Cu_{12}Ni_{20}$] to the trained model, is output in 3 minutes, but the graph of density of state for each energy level of the material [$Cu_{12}Ni_{20}$] that is estimated using DFT is output in 49 hours.

Figure 14C:
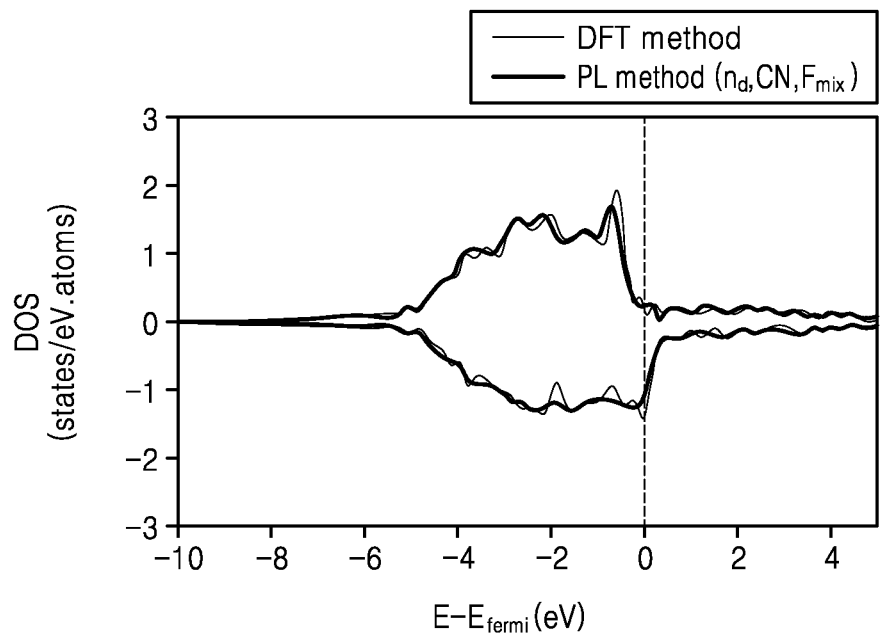

FIG. 14C shows a graph of density of state for each energy level that is estimated by applying data related to elements constituting a material [$Cu_{0.375}Ni_{0.625}$] to a trained model and a graph of density of state for each energy level that is estimated using DFT.

The graph of density of state for each energy level of the material [$Cu_{0.375}Ni_{0.625}$], which is generated by using the trained model, matches approximately 96% of the graph of density of state for each energy level of the material [$Cu_{0.375}Ni_{0.625}$] that is estimated using DFT.

The graph of density of state for each energy level of the material [$Cu_{0.375}Ni_{0.625}$], which is estimated by using the trained model, is output in one minute when only one core of an Intel Xeon CPU is used. The graph of density of state for each energy level of the material [$Cu_{0.375}Ni_{0.625}$] that is estimated using DFT is output in 2 hours when 16 cores of the Intel Xeon CPU are used.

Figure 14D:
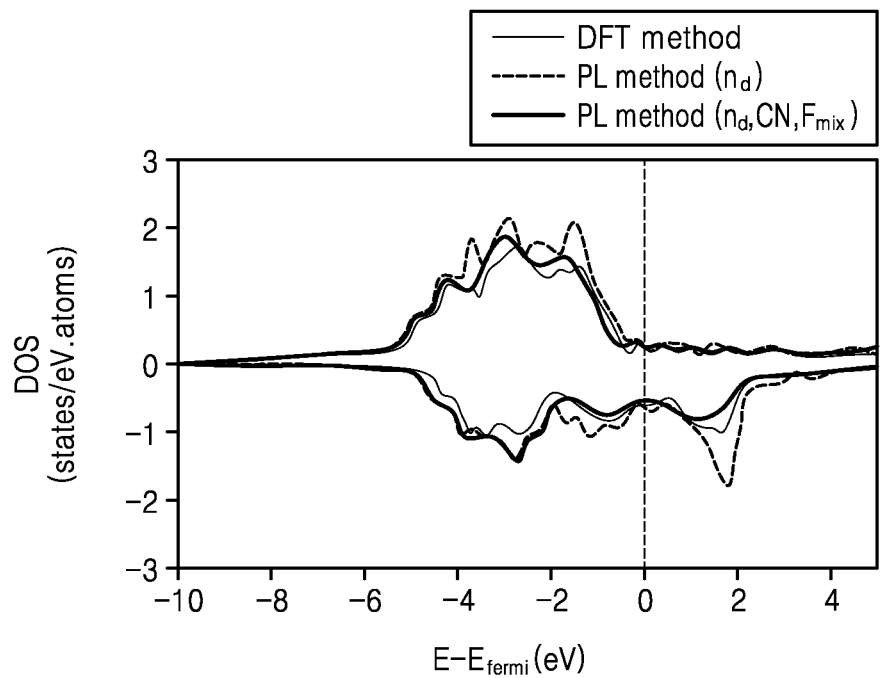

FIG. 14D shows a graph of density of state for each energy level that is generated by applying data about elements constituting the material [$Cu_{0.375}Fe_{0.625}$] to a first trained model which determines a coefficient of a principal component vector considering only the d-orbital electron occupation rate ($n_d$), a graph of density of state for each energy level that is generated by applying the data about elements constituting the material [$Cu_{0.375}Fe_{0.625}$] to a second trained model which determines a coefficient of a principal component vector considering the d-orbital electron occupation rate ($n_d$), the coordination number (CN), and the mixing factor ($F_{mix}$), and a graph of density of state for each energy level that is estimated using DFT.

Referring to FIG. 14D, the graph of density of state for each energy level of the material [$Cu_{0.375}Fe_{0.625}$], which is generated by using the first trained model, matches approximately 85% of the graph of density of state for each energy level of the material [$Cu_{0.375}Fe_{0.625}$] that is estimated using DFT.

The graph of density of state for each energy level of the material [$Cu_{0.375}Fe_{0.625}$], which is generated by using the second trained model, matches approximately 94% of the graph of density of state for each energy level of the material [$Cu_{0.375}Fe_{0.625}$] that is estimated using DFT.

Since the material [$Cu_{0.375}Fe_{0.625}$] material is not a complete solid solution material, it is necessary to estimate the graph of density of state for each energy level with a trained model by considering a crystal structure of the material together with composition information of the material. That is, an accurate graph of density of state for each energy level of the first material may be obtained by determining the coefficient of the principal component vector in consideration of a coordination number and a mixing factor, which are information related to the crystal structure of the material, and a d-orbital electron occupation rate, which is information related to the composition of the material.

The graph of density of state for each energy level of the material [$Cu_{0.375}Fe_{0.625}$], which is estimated by using the second trained model, is output in one minute when only one core of an Intel Xeon CPU is used. The graph of density of state for each energy level of the material [v] that is estimated using DFT is output in 2 hours when 16 cores of the Intel Xeon CPU are used.

Figure 14E:
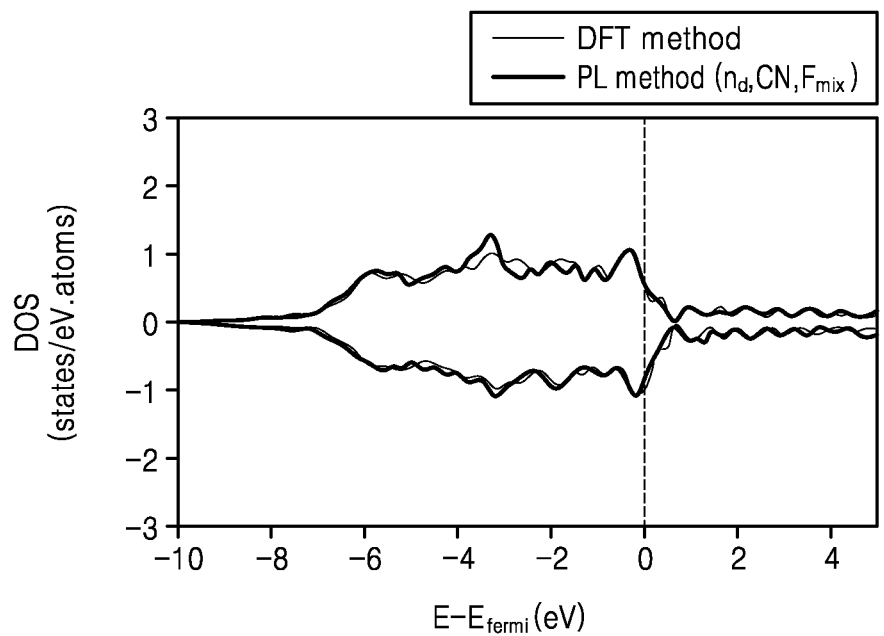

FIG. 14E shows a graph of density of state for each energy level that is generated by determining a similarity between a first material composed of three elements and a plurality of second materials and by applying data related to elements of the material [$Cu_{0.03}Ni_{0.03}Pt_{0.94}$] to a third trained model that is generated by applying a weight of each of the plurality of second materials based on the determined similarity, and a graph of density of state for each energy level that is estimated using DFT.

Referring to FIG. 14E, the graph of density of state for each energy level of the material [$Cu_{0.03}Ni_{0.03}Pt_{0.94}$], which is generated by using the third trained model, matches approximately 96% of the graph of density of state for each energy level of the material [$Cu_{0.03}Ni_{0.03}Pt_{0.94}$] that is estimated using DFT.

The graph of density of state for each energy level of the material [$Cu_{0.03}Ni_{0.03}Pt_{0.94}$], which is estimated by using the second trained model, is output in one minute when only one core of an Intel Xeon CPU is used.

Figure 14F:
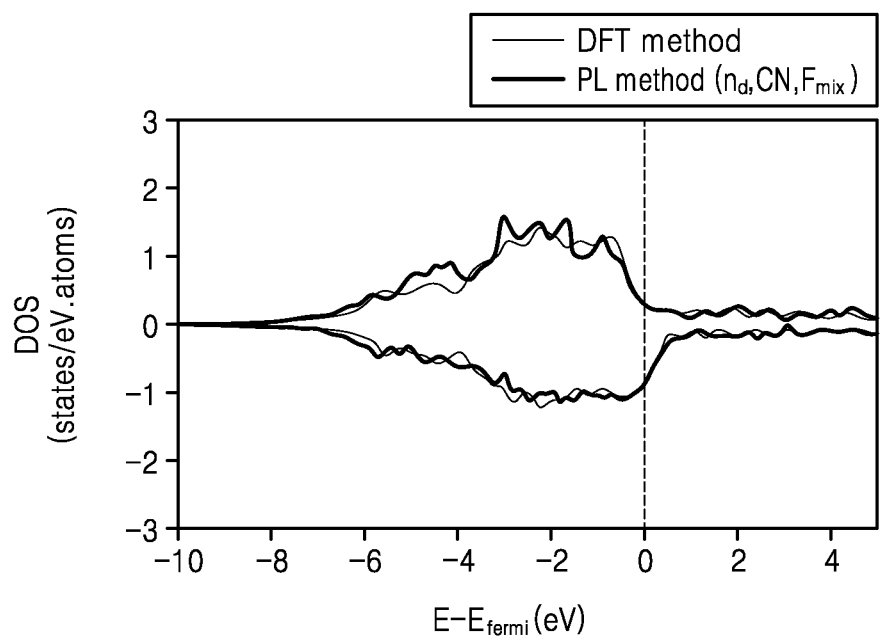

FIG. 14F shows a graph of density of state for each energy level that is generated by applying data related to elements of the material [$Cu_{0.03}Ni_{0.03}Pt_{0.94}$] to the third trained model and a graph of density of state for each energy level that is estimated using DFT.

Referring to FIG. 14F, the graph of density of state for each energy level of the material [$Cu_{0.31}Ni_{0.31}Pt_{0.38}$], which is generated by using the third trained model, matches approximately 96% of the graph of density of state for each energy level of the material [$Cu_{0.31}Ni_{0.31}Pt_{0.38}$] that is estimated using DFT.

The graph of density of state for each energy level of the material [$Cu_{0.31}Ni_{0.31}Pt_{0.38}$], which is estimated by using the second trained model, is output in one minute when only one core of an Intel Xeon CPU is used.

That is, referring to FIGS. 14A to 14F, a method of estimating a graph of density of state for each energy level of a material using a trained model of the disclosed embodiment may save more time than a method of estimating a graph of density of state for each energy level of a material using a conventional DFT. However, it can be seen that the accuracy is not significantly different.

In addition, in the trained model of the disclosed embodiment, the accuracy of the estimated graph of density of state for each energy level may be improved as pieces of data related to elements of the material and data related to an electronic structure of the material are increased.

Furthermore, it is obvious that as the number of elements constituting the material increases, the method of estimating the graph of density of state for each energy level of the material using the trained model of the disclosed embodiment may save more time than the method of estimating the graph of density of state for each energy level of the material using the conventional DFT.

Figure 15A:
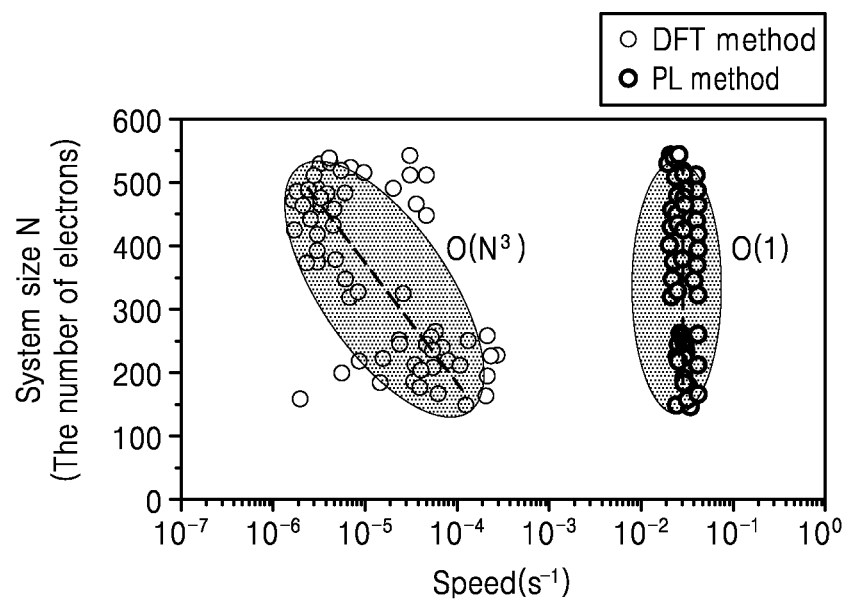
FIGS. 15A and 15B are views comparing a result of generating a graph of density of state for each energy level estimated according to an embodiment with a result of generating an energy-graph of density of state estimated according to a DFT.
Figure 15B:
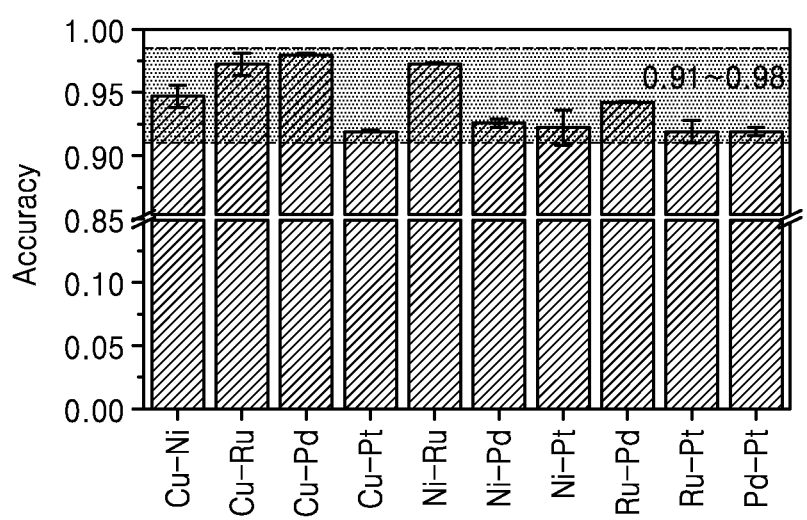

FIGS. 15A and 15B are views comparing a result of generating a graph of density of state for each energy level estimated according to an embodiment with a result of generating an energy-graph of density of state estimated according to a DFT.

FIG. 15A shows a comparison between speeds of calculating the density of state for each energy level with a function related to the number of electrons of a material.

Referring to FIG. 15A, in a method of estimating a graph of density of state for each energy level of the material using the conventional DFT, a relationship between the number of electrons in the material and time required to calculate the density of state for each energy level may be shown as a function of $O(N^3)$. That is, it can be seen that time proportional to the cube of the number of electrons of the material takes a calculation time.

Meanwhile, in a method of estimating a graph of density of state for each energy level of the material using a trained model of the disclosed embodiment, a relationship between the number of electrons of the material and time required to calculate the density of state for each energy level may be shown as a function of $O(1)$. That is, it can be seen that it takes a certain time regardless of the number of electrons in the material.

FIG. 15B, with respect materials of Cu—Ni, Cu—Ru, Cu—Pd, Cu—Pt, Ni—Ru, Ni—Pd, Ni—Pt, Ru—Pd, Ru—Pt, and Pd—Pt, is a view of comparing a similarity between a graph of density of state for each energy level that is estimated using a trained model and a graph of density of state for each energy level of the materials that is estimated using a conventional DFT.

Referring to FIG. 15B, the graph of density of state for each energy level of the material [Cu—Ni], which is estimated by using a trained model of the disclosed embodiment, matches approximately 95% of a graph of density of state for each energy level of the material [Cu—Ni] that is estimated using the conventional DFT.

Also, the graph of density of state for each energy level of the material [Cu—Ru], which is estimated by using a trained model of the disclosed embodiment, matches approximately 97% of a graph of density of state for each energy level of the material [Cu—Ru] that is estimated using the conventional DFT.

Also, the graph of density of state for each energy level of the material [Cu—Pd], which is estimated by using a trained model of the disclosed embodiment, matches approximately 98% of a graph of density of state for each energy level of the material [Cu—Pd] that is estimated using the conventional DFT.

Also, the graph of density of state for each energy level of the material [Cu—Pt], which is estimated by using a trained model of the disclosed embodiment, matches approximately 91% of a graph of density of state for each energy level of the material [Cu—Pt] that is estimated using the conventional DFT.

Also, the graph of density of state for each energy level of the material [Ni—Ru], which is estimated by using a trained model of the disclosed embodiment, matches approximately 97% of a graph of density of state for each energy level of the material [Ni—Ru] that is estimated using the conventional DFT.

Also, the graph of density of state for each energy level of the material [Ni—Pd], which is estimated by using a trained model of the disclosed embodiment, matches approximately 92% of a graph of density of state for each energy level of the material [Ni—Pd] that is estimated using the conventional DFT.

Also, the graph of density of state for each energy level of the material [Ni—Pt], which is estimated by using a trained model of the disclosed embodiment, matches approximately 92% of a graph of density of state for each energy level of the material [Ni—Pt] that is estimated using the conventional DFT.

Also, the graph of density of state for each energy level of the material [Ru—Pd], which is estimated by using a trained model of the disclosed embodiment, matches approximately 94% of a graph of density of state for each energy level of the material [Ru—Pd] that is estimated using the conventional DFT.

Also, the graph of density of state for each energy level of the material [Ru—Pt], which is estimated by using a trained model of the disclosed embodiment, matches approximately 91% of a graph of density of state for each energy level of the material [Ru—Pt] that is estimated using the conventional DFT.

Also, the graph of density of state for each energy level of the material [Pd—Pt], which is estimated by using a trained model of the disclosed embodiment, matches approximately 91% of a graph of density of state for each energy level of the material [Pd—Pt] that is estimated using the conventional DFT.

That is, referring to FIGS. 15A and 15B, when the trained model of the disclosed embodiment is used, it is possible to estimate the graph of density of state for each energy level at a constant speed irrespective of the number of electrons in the material. Also, it can be seen that the accuracy thereof is not significantly different from that of the graph of density of state for each energy level of the material that is estimated using the conventional DFT.

In addition, the trained model of the disclosed embodiment may more accurately estimate the graph of density of state for each energy level as pieces of data related to elements of the material and data related to an electronic structure of the material are increased.

Figure 16:
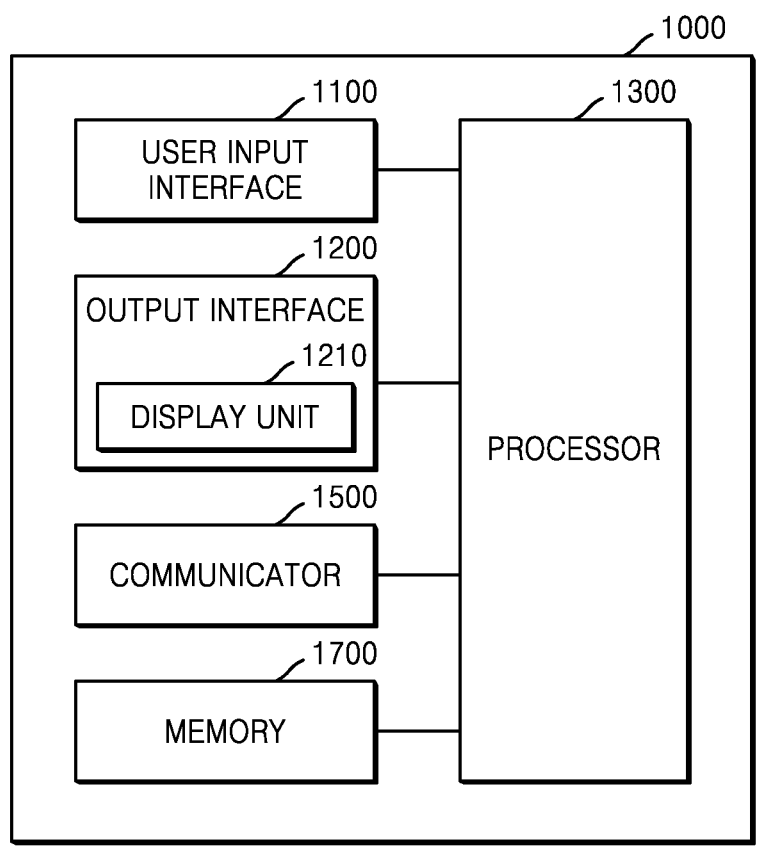
FIG. 16 is a block diagram of an electronic device, according to an embodiment.

FIG. 16 is a block diagram of an electronic device, according to an embodiment.

Referring to FIG. 16, the external device 1000 may include a user input interface 1100, an output interface 1200, a processor 1300, a communicator 1500 and a memory 1700. However, not all elements shown in FIG. 16 are necessary elements of the electronic device 1000. That is, the electronic device 1000 may be embodied with more or less elements than the elements shown in FIG. 16.

The user input interface 1100 may be a unit by which a user inputs data for controlling the electronic device 1000. For example, the user input interface 1100 may include a keypad, a dome switch, a touch pad (a contact capacitance type, a pressure resistance film type, an infrared sensing type, an ultrasonic transmission type in a surface, a integral tension measurement type, a piezoelectric effect type, etc.), a jog wheel, a jog switch and the like, but is not limited thereto.

The output interface 1200 displays and outputs information that is processed in the electronic device 1000. The output interface 1200 may include a display unit 1210 that outputs a result of predicting an electronic structure of a material. For example, the display unit 1210 may display a graph of density of state for each energy level of a material corresponding to input data of a user related to elements constituting the material. The display unit 1210 may display a user interface for receiving the data related to the elements constituting the material.

The processor 1300 typically controls the overall operation of the electronic device 1000. For example, the processor 1300 may generally control the user input interface 1100, the output interface 1200, the communicator 150, and the like by executing programs stored in the memory 1700. Furthermore, the processor 1300 may perform operations of the electronic device 1000 in FIGS. 1 to 13 by executing the programs stored in the memory 1700.

The processor 1300 may control the user input interface 1100 to receive data about the elements constituting the material. The processor 1300 may predict the electronic structure of the material based on the data input from a user. The processor 1000 may output a result of the predicting of the electronic structure of the material.

According to an embodiment, the processor 1300 may control the user input interface 1100 to receive data about elements constituting a first material to predict the electronic structure. According to an embodiment, the processor 1300 may apply data about the number of elements constituting the first material, the kinds of elements, the number of atoms, the number of electrons, the chemical formula, and the empirical formula input from a user to a trained model for estimating the density of state of the material, and may predict the electronic structure of the material.

According to an embodiment, the processor 1300 may generate a graph of density of state for each energy level of the first material to predict an electronic structure of the first material and may output the generated graph of density of state for each energy level of the first material.

According to an embodiment, the processor 1300 may control the user input interface 1100 to receive data about a plurality of second materials as training data to apply to a trained model for predicting the electronic structure of the first material. The second materials may be composed of at least some of the plurality of elements constituting the first material. According to an embodiment, the processor 1300 may convert the training data into feature data for application to the trained model. For example, the processor 1000 may convert each of graphs of density of state for each energy level of the plurality of second materials into a grid image. The processor 1300 may convert the converted grid images into a plurality of matrices. The processor 1300 may convert the converted matrices into an image vector representing the density of state for each energy level of the plurality of second materials. The processor 1300 may apply the converted feature data to the trained model.

According to an embodiment, the processor 1300 may determine a criterion for predicting the electronic structure of the material using the feature data applied to the trained model. For example, the processor 1300 may determine the criterion for predicting the electronic structure of the material using the converted plurality of grid images. Alternatively, the processor 1300 may determine the criterion for predicting the electronic structure of the material using the matrices obtained by converting the grid images. Alternatively, the processor 1300 may determine the criterion for predicting the electronic structure of the material using image vectors obtained by converting the matrices.

The processor 1300 may determine a principal component vector for generating a graph of density of state for each energy level of the material as the criterion for predicting the electronic structure of the material. The processor 1300 may determine the number of the principal component vector as the criterion for predicting the electronic structure of the material. The processor 1300 may determine a coefficient of the principal component vector as the criterion for predicting the electronic structure of the material. The processor 1300 may determine a relationship among the coefficient of the principal component vector, composition information of the material, and crystal structure information of the material as the criterion for predicting the electronic structure of the material. For example, the processor 1300, as the criterion for predicting the electronic structure of the material, may determine a relationship between the coefficient of the principal component vector and at least one of a d-orbital electron occupation rate of the material, a coordination number (CN) of the material, and a mixing factor ($F_{mix}$) of the material.

The processor 1300 may determine coefficients of the principal component vector corresponding to a d-orbital electron occupation rate of the first material, a coordination number of the first material, and a mixing factor of the first material, respectively. The processor 1300 may determine a weight to be applied to each of the coefficients of the principal component vector corresponding to the d-orbital electron occupation rate of the first material, the coordination number of the first material, and the mixing factor of the first material, respectively. The processor 1300 may determine the respective coefficients of the principal components of the first material by linearly combining the coefficients of the principal component vector to which the weights are applied. The processor 1300 may convert each graph of density of state for each energy level of the plurality of second materials received as training data into a grid image. The processor 1300 may convert the grid image into a matrix. The processor 1300 may determine a principal component vector based on the converted matrix.

The processor 1300 may determine at least one principal component vector by performing principal component analysis (PCA) on a matrix for each of the plurality of second materials. The processor 1300 may calculate covariance of the matrix for each of the plurality of second materials. The processor 1300 may calculate at least one eigenvector and at least one eigenvalue based on the calculated covariance. The processor 1300 may determine a principal component for a plurality of matrices using at least one eigenvector and at least one eigenvalue.

The processor 1300 may generate a covariance matrix using image vectors representing each density of state for each energy level of the plurality of second materials. The processor 1300 may calculate at least one eigenvector and at least one eigenvalue from the covariance matrix. The processor 1300 may determine the calculated at least one eigenvector as the principal component vector.

According to an embodiment, the processor 1300 may determine a second coefficient of the principal component vector from data related to the second material. Also, the second coefficient is a coefficient for expressing a characteristic of the density of state for each energy level of the second material with respect to the determined at least one principal component vector.

According to an embodiment, the processor 1300 may obtain at least one of a d-orbital electron occupation rate of the second material, a coordination number of the second material, and a mixing factor of the second material.

According to an embodiment, the processor 1300 may estimate a relationship between the coefficient of the principal component vector and at least one of the d-orbital electron occupation rate of the second material, the coordination number of the second material, and the mixing factor of the second material. For example, the processor 1300 may represent the estimated relationship as a linear graph.

According to an embodiment, the processor 1300 may determine a first coefficient of the principal component vector from the estimated relationship. Also, the first coefficient is a coefficient for expressing a characteristic of the density of state for each energy level of the first material with respect to the at least one principal component vector.

The processor 1300 may determine the first coefficient by performing linear interpolation on the linear graph.

According to an embodiment, the processor 1300 may determine the first coefficient based on a similarity between the first material and a plurality of second materials similar to the first material. Also, the first coefficient is a coefficient for expressing a characteristic of the density of state for each energy level of the first material with respect to the at least one principal component vector. The processor 1300 may determine the similarity between each of the plurality of second materials and the first material by comparing first composition information of the first material with second composition information of each of the plurality of second materials and comparing the first crystal structure information of the first material with the second composition information of each of the plurality of second materials. The processor 1300 may determine a weight of each of the plurality of second materials based on the similarity between the first material and each of the plurality of second materials. The processor 1300 may determine the first coefficient by linearly combining the determined weights with a coefficient of a principal component vector of each of the plurality of second materials.

According to an embodiment, the processor 1300 may estimate the electronic structure of the first material using a determined criterion. The processor 1300 may output a result of the estimating of the electronic structure of the first material. For example, the processor 1300 may generate a graph of density of state for each energy level of the first material using the determined principal component vector, the number of principal component vectors, and the first coefficient of the principal component vector.

According to an embodiment, the processor 1300 may apply the electronic structure of the first material estimated by the processor 1300 to a trained model as training data. For example, the processor 1300 may apply data related to the elements constituting the first material and the graph of density of state for each energy level of the first material as training data.

The processor 1300 may accurately predict the electronic structure of the first material as pieces of data about elements of the second material and data about an electronic structure of the second material are increased.

The processor 1300 may train a first trained model by applying the electronic structure of the first material predicted by the processor 1300 to the first trained model as training data. Further, the processor 1300 may train a second trained model by re-estimating an electronic structure of at least one of the second materials estimated by the processor 1300 in a second trained model that is newly trained and by applying a result of the estimating to the trained model as training data. That is, the processor 1300 estimates the electronic structure of the material and repeatedly applies a result of the estimating to the trained model as training data, thereby accurately estimating the electronic structure.

Furthermore, the processor 1300 may predict the electronic structure of the first material using a data recognition model stored in the memory 1700 or a server 2000.

Also, the processor 1300 may efficiently learn the criterion for predicting the electronic structure of the first material by using the data recognition model stored in the memory 1700 or the server 2000, and may accurately predict the electronic structure of the first material quickly according to a result of the learning.

The communicator 1500 may include one or more components that allow the electronic device 1000 to communicate with another device (not shown) and the server 2000.

The other device (not shown) may be a computing device such as electronic device 1000, or may be a sensing device, but is not limited thereto.

Furthermore, the communicator 1500 may transmit and receive information necessary for executing the operation of predicting the electronic structure of the first material to another device (not shown) and the server 2000.

The memory 1700 may store a program for processing and controlling the processor 1300, and may store a plurality of pieces of data that are input to or output from the terminal 1000.

The memory 1700 may include a system memory (e.g., random access memory (RAM), static RAM (SRAM), read-only memory (ROM), electrically erasable programmable ROM (EEPROM), or programmable ROM (PROM)), a data storage (e.g., a memory of a flash memory type, a hard disk type, a multimedia card micro type, or a card type (e.g., an SD or XD memory), a magnetic memory, a magnetic disk, or an optical disk) of the electronic device 1000.

Figure 17:
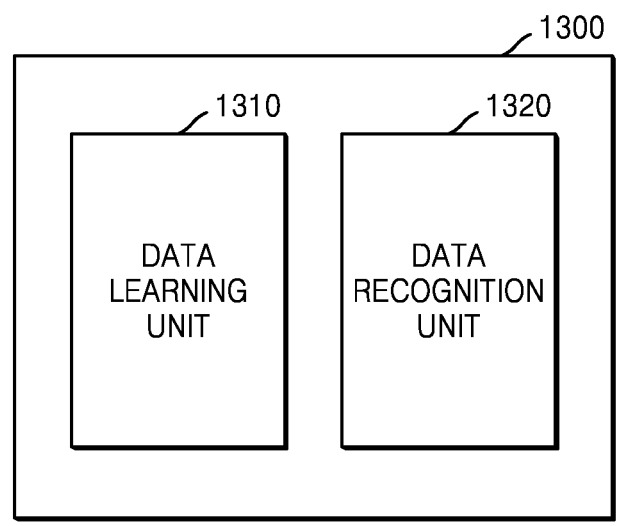
FIG. 17 is a block diagram of a controller of an electronic device, according to an embodiment.

FIG. 17 is a block diagram of a controller of an electronic device, according to an embodiment.

Referring to FIG. 17, the image processing device 1300 according to some embodiments may include a data learning unit 1310 and a data recognition unit 1320.

The data learning unit 1310 may learn a criterion for predicting the electronic structure of the first material.

The data recognition unit 1320 may predict the electronic structure of the first material by using a trained data recognition model. The data recognition unit 1320 may obtain certain data according to a criterion preset by learning and use the data recognition model with the obtained data as an input value. Further, a resultant value output by the data recognition model with the obtained data as the input value may be used to update the data recognition model.

At least one of the data learning unit 1310 and the data recognition unit 1320 may be manufactured in the form of at least one hardware chip and mounted on the electronic device. For example, at least one of the data learning unit 1310 and the data recognition unit 1320 may be manufactured in the form of a dedicated hardware chip for artificial intelligence (AI) or may be manufactured as a portion of a conventional general-purpose processor (e.g., a central processing unit (CPU) or an application processor) or a graphics-dedicated processor (e.g., a graphic processing unit (GPU)) to be mounted on the various electronic devices as described above.

In this case, the data learning unit 1310 and the data recognition unit 1320 may be mounted on one electronic device or on separate electronic devices, respectively. For example, one of the data learning unit 1310 and the data recognition unit 1320 may be included in the electronic device and the other one may be included in a server. Furthermore, the data learning unit 1310 and the data recognition unit 1320 may provide model information constructed by the data learning unit 1310 to the data recognition unit 1320 in a wired or wireless manner, and data input to the data recognition unit 1320 may be provided to the data learning unit 1310 as additional training data.

Meanwhile, at least one of the data learning unit 1310 and the data recognition unit 1320 may be implemented as a software module. When at least one of the data learning unit 1310 and the data recognition unit 1320 is implemented as a software module (or a program module including instructions), the software module may be stored in a non-transitory computer-readable recording medium. Alternatively, at least one software module may be provided by an operating system (OS) or a certain application. Alternatively, some of the at least one software module may be provided by the OS, and some of the remaining may be provided by a certain application.

Figure 18:
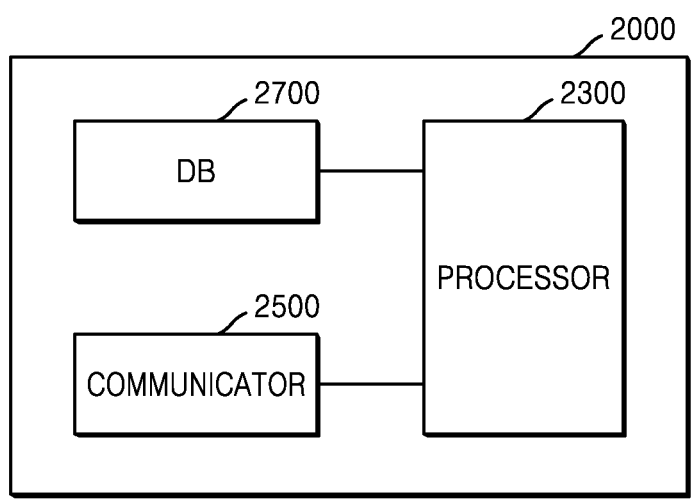
FIG. 18 is a block diagram of a server in conjunction with an electronic device, according to an embodiment.

FIG. 18 is a block diagram of a server in conjunction with an electronic device, according to an embodiment.

Referring to FIG. 18, the server 2000 according to some embodiments may include a communicator 2500, a DB 2700, and a processor 2300.

The communicator 2500 may include one or more elements for communicating with the electronic device 1000.

The DB 2700 may store data and programs for predicting an electronic structure of a first material.

The processor 2300 typically controls the overall operation of the server 2000. For example, the processor 2300 may entirely control the DB 2700 and the communicator 2500 by executing programs stored in the DB 2700 of the server 2000. The processor 2300 may perform some of the operations of the electronic device 1000 in FIGS. 1 to 13 by executing the programs stored in the DB 2700.

In addition, the processor 2300 may predict the electronic structure of the first material.

Also, the processor 2300 may efficiently learn the criterion for predicting the electronic structure of the first material by using the data recognition model stored in the DB 2700, and may accurately predict the electronic structure of the first material quickly according to a result of the learning.

Meanwhile, the electronic device 1000 and the server 2000 may effectively distribute and perform tasks for learning and data recognition of data recognition model, thereby efficiently performing data processing in order to provide a service conforming to a user's intention and effectively protecting user's privacy.

The one or more embodiments may be embodied as computer readable code/instructions on a recording medium, e.g., a program module to be executed in computers, the program module including computer-readable commands. A non-transitory computer readable medium may be any usable medium that may be accessed by a computer, and may include any usable medium, such as, a volatile and non-volatile medium and a discrete type and non-discrete type medium. Also, the non-transitory computer readable medium may include all computer storing media and communication media. The computer storing medium may include any medium, such as, a volatile and non-volatile medium and a discrete type and non-discrete type medium that is realized by a method or technique for storing information, such as, a computer readable command, a data structure, a program module, or other data. The communication medium may typically include a computer readable command, a data structure, or a program module.

Throughout the specification, a term "unit" or "part" indicates a hardware component such as a processor or a circuit, and/or a software component that is executed by a hardware component such as a processor.

The embodiments are examples, and thus, it will be understood by those of ordinary skill in the art that various changes in form and details may be made therein without departing from the spirit and scope of the present disclosure. Therefore, the embodiments should be considered in descriptive sense only and not for purposes of limitation. For example, each constituent element that is described as a singular form may be embodied in distribution forms. Also, constituent elements that are described in distribution forms may be embodied in a combined form.

Therefore, the scopes of the present disclosure are defined not by the detailed description but by the appended claims, and all differences within the scope will be construed as being included in the embodiments.

What is claimed is:

1. A method, performed by an electronic device, of predicting an electronic structure of a first material, the method comprising:
receiving input data of a user related to a plurality of elements constituting the first material;
applying the received input data to a trained model for estimating a density of state of the first material; and
outputting a first graph indicating the density of state for each energy level of the first material output from the trained model,
wherein the trained model is trained to generate the first graph based on pre-input data about a plurality of second materials composed of at least some of the elements constituting the first material and a plurality of second graphs representing the density of state for each energy level of the plurality of second materials; and
wherein the trained model is trained to:
convert each of the plurality of second graphs into a grid image,
determine at least one principal component vector representing a characteristic of the first graph, based on the grid images obtained by converting the plurality of second graphs, and
generate the first graph based on the determined at least one principal component vector.

2. The method of claim 1, wherein the trained model is trained to:
obtain, from the received input data of the user, at least one of composition information indicating an electronic structure of each of the plurality of elements constituting the first material and crystal structure information indicating a crystal structure of the first material,
determine a coefficient of the at least one principal component vector based on at least one of the obtained composition information and the crystal structure information, and
generate the first graph based on a linear combination of the determined at least one principal component vector and the determined coefficient of the at least one principal component vector.

3. The method of claim 2, wherein the composition information comprises a d-orbital electron occupation rate of each of the plurality of elements constituting the first material, and
the trained model is trained to determine a coefficient of the at least one principal component vector based on the obtained d-orbital electron occupation rates.

4. The method of claim 2, wherein the crystal structure information comprises at least one of a coordination number of the first material and a mixing factor of the first material, and
the trained model is trained to determine a coefficient of the at least one principal component vector based on the obtained coordination number and the mixing factor.

5. The method of claim 2, wherein the trained model is trained to:
determine a weight to be applied to each of the composition information and the crystal structure information based on kinds of the elements constituting the first material, and
determine the coefficient of the at least one principal component vector based on the determined weight.

6. The method of claim 1, wherein the trained model is trained to:
determine a similarity between each of the plurality of second materials and the first material,
determine a coefficient of the at least one principal component vector based on the determined similarity, and
generate the first graph based on a linear combination of the determined at least one principal component vector and the determined coefficient of the at least one principal component vector.

7. The method of claim 6, wherein the trained model is trained to:
obtain, from the received input data of the user, first composition information indicating an electronic structure of each of the plurality of elements constituting the first material and first crystal structure information indicating a crystal structure of the first material,
obtain, from training data, second composition information and second crystal structure information of a third material, which is one of the plurality of second materials, and
determine a similarity between the first material and the third material based on the obtained first composition information, the first crystal structure information, the second composition information, and the second crystal structure information.

8. The method of claim 7, wherein the first composition information comprises a d-orbital electron occupation rate of each of the plurality of elements constituting the first material,
the second composition information comprises a d-orbital electron occupation rate of each of a plurality of elements constituting the third material, and
the trained model is trained to determine the similarity between the first material and the third material based on the d-orbital electron occupation rate of each of the plurality of elements constituting the first material and the d-orbital electron occupation rate of each of the plurality of elements constituting the third material.

9. The method of claim 7, wherein the first crystal structure information comprises a coordination number of the first material and a mixing factor of the first material,
the second crystal structure information comprises a coordination number of the third material and a mixing factor of the third material, and
the trained model is trained to determine the similarity between the first material and the third material based on the coordination number of the first material, the mixing factor of the first material, the coordination number of the third material, and the mixing factor of the third material.

10. The method of claim 7, wherein the trained model is trained to:
determine a weight to be applied to a coefficient of a principal component vector of each of the plurality of second materials based on the similarity between the first material and the third material, and
determine a coefficient of the at least one principal component vector used to generate the first graph based on the determined weight.

11. The method of claim 10, wherein the trained model is trained to:
generate an image vector representing the density of state for each energy level of the first material based on a linear combination of the determined at least one principal component vector and the determined coefficient of the at least one principal component vector, convert the generated image vector into a matrix, and generate the first graph based on the converted matrix.

12. The method of claim 11, wherein the trained model is trained to:
   convert the matrix into a probability matrix indicating a probability that density of state exists for each energy level, and
   generate the first graph based on the converted probability matrix.

13. An electronic device for predicting an electronic structure of a first material, the electronic device comprising:
   a user input interface receiving input data of a user related to a plurality of elements constituting the first material;
   a processor applying the received input data to a trained model for estimating a density of state of the first material; and
   an output interface outputting a first graph indicating the density of state for each energy level of the first material output from the trained model,
   wherein the trained model is trained to
      generate the first graph based on pre-input data about a plurality of second materials composed of at least some of the elements constituting the first material and a plurality of second graphs representing the density of state for each energy level of the plurality of second materials,
      convert each of the plurality of second graphs into a grid image,
      determine at least one principal component vector representing a characteristic of the first graph, based on the grid images obtained by converting the plurality of second graphs, and
      generate the first graph based on the determined at least one principal component vector.

14. A non-transitory computer-readable recording medium having recorded thereon a program which, when executed by a computer, performs the method according to claim 1.

* * * * *